United States Patent
Akagi et al.

(10) Patent No.: US 10,412,253 B2
(45) Date of Patent: Sep. 10, 2019

(54) LINE SENSOR, IMAGE READING DEVICE, AND IMAGE FORMING APPARATUS

(71) Applicant: CANON KABUSHIKI KAISHA, Tokyo (JP)

(72) Inventors: Daisuke Akagi, Tokyo (JP); Masanori Ogura, Tokyo (JP); Jun Iba, Yokohama (JP); Atsushi Furubayashi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/036,133

(22) Filed: Jul. 16, 2018

(65) Prior Publication Data

US 2018/0324317 A1    Nov. 8, 2018

Related U.S. Application Data

(63) Continuation of application No. 15/629,599, filed on Jun. 21, 2017, now Pat. No. 10,063,732, which is a
(Continued)

(30) Foreign Application Priority Data

Dec. 25, 2014  (WO) .................. PCT/JP2014/084433

(51) Int. Cl.
  *H04N 1/46*  (2006.01)
  *H04N 1/028*  (2006.01)
  (Continued)

(52) U.S. Cl.
  CPC ............. *H04N 1/0282* (2013.01); *G02B 5/20* (2013.01); *H01L 27/14* (2013.01); *H04N 1/028* (2013.01);
  (Continued)

(58) Field of Classification Search
  CPC .. H04N 1/0282; H04N 1/028; H04N 1/02895; H04N 1/03; H04N 1/191; H04N 9/07; G02B 5/20; H01L 27/14
  (Continued)

(56) References Cited

U.S. PATENT DOCUMENTS 5,948,281 A     9/1999  Okazaki
6,163,352 A *  12/2000  Ichikawa ............ G02F 1/13624
                                                       349/106
(Continued)

FOREIGN PATENT DOCUMENTS

CN       1825607 A     8/2006
CN     101308860 A    11/2008
(Continued)

*Primary Examiner* — Cheukfan Lee
(74) *Attorney, Agent, or Firm* — Canon U.S.A., Inc. IP Division

(57) ABSTRACT

In a line sensor including color filters periodically disposed in a light-receiving-element row, a "mixture of colors" problem occurs when light that has been transmitted through a color filter differing from a color filter corresponding to a light receiving element is incident upon the light receiving element. To prevent the "mixture of colors" from occurring, in a CMOS sensor 107 including a light-receiving-element row in which a plurality of photodiodes 1204 are disposed side by side in a main scanning direction and a plurality of color filters 1202 that are disposed in correspondence with the plurality of photodiodes 1204, the center of each color filter 1202, other than the center color filter that corresponds to the center photodiode of the light-receiving-element row, is displaced in a direction toward the center of the light-receiving-element row from the center of the photodiode 1204 corresponding to the color filter.

24 Claims, 23 Drawing Sheets

Related U.S. Application Data continuation of application No. PCT/JP2015/085497, filed on Dec. 18, 2015.

(51) Int. Cl.
*G02B 5/20* (2006.01)
*H01L 27/14* (2006.01)
*H04N 9/07* (2006.01)
*H04N 1/191* (2006.01)
*H04N 1/03* (2006.01)

(52) U.S. Cl.
CPC ............ *H04N 1/02895* (2013.01); *H04N 1/03* (2013.01); *H04N 1/191* (2013.01); *H04N 9/07* (2013.01)

(58) Field of Classification Search
USPC .............. 358/514, 512, 513, 505, 482, 483; 250/208.1, 216
See application file for complete search history.

(56) References Cited

U.S. PATENT DOCUMENTS

| | | | | |
|---|---|---|---|---|
| 6,281,867 | B2* | 8/2001 | Kurematsu | 345/589 |
| 9,362,323 | B2* | 6/2016 | Uehira | H01L 27/14627 |
| 10,180,354 | B2* | 1/2019 | Kurokawa | H01L 21/8234 |
| 2002/0020845 | A1* | 2/2002 | Ogura | H01L 27/14806 |
| | | | | 257/88 |
| 2004/0238908 | A1* | 12/2004 | Hashimoto | H01L 27/14623 |
| | | | | 257/432 |
| 2005/0174617 | A1* | 8/2005 | Hosier | H04N 1/486 |
| | | | | 358/514 |
| 2006/0049476 | A1* | 3/2006 | Koizumi | H01L 27/14627 |
| | | | | 257/432 |
| 2009/0230491 | A1* | 9/2009 | Iida | H01L 27/14623 |
| | | | | 257/432 |
| 2010/0066876 | A1* | 3/2010 | Kurihara | H01L 27/14621 |
| | | | | 348/273 |
| 2011/0242628 | A1* | 10/2011 | Morikawa | H04N 1/00037 |
| | | | | 358/504 |
| 2012/0200728 | A1* | 8/2012 | Kobayashi | H01L 27/14623 |
| | | | | 348/222.1 |
| 2013/0037902 | A1* | 2/2013 | Nakazawa | H01L 27/14623 |
| | | | | 257/432 |
| 2013/0208172 | A1* | 8/2013 | Tashiro | H01L 27/14621 |
| | | | | 348/340 |
| 2013/0229543 | A1* | 9/2013 | Hashimoto | H04N 5/35545 |
| | | | | 348/222.1 |
| 2013/0229557 | A1* | 9/2013 | Hashimoto | H04N 5/3745 |
| | | | | 348/301 |
| 2014/0253767 | A1* | 9/2014 | Kato | H01L 27/14625 |
| | | | | 348/280 |
| 2015/0214270 | A1* | 7/2015 | Yomori | H01L 27/14685 |
| | | | | 438/69 |
| 2015/0349011 | A1* | 12/2015 | Kato | H01L 27/14625 |
| | | | | 250/201.4 |
| 2015/0350529 | A1* | 12/2015 | Kato | H04N 5/3696 |
| | | | | 348/345 |
| 2016/0218127 | A1* | 7/2016 | Kato | H01L 27/14609 |
| 2017/0353611 | A1* | 12/2017 | Koyama | H04N 1/401 |
| 2017/0353612 | A1* | 12/2017 | Morikawa | H04N 1/00037 |
| 2018/0166487 | A1* | 6/2018 | Noudo | G02B 7/34 |

FOREIGN PATENT DOCUMENTS

| | | |
|---|---|---|
| CN | 101546778 A | 9/2009 |
| CN | 101951470 A | 1/2011 |
| CN | 103650143 A | 3/2014 |
| JP | 2012-169673 A | 9/2012 |

\* cited by examiner

MAIN SCANNING DIRECTION

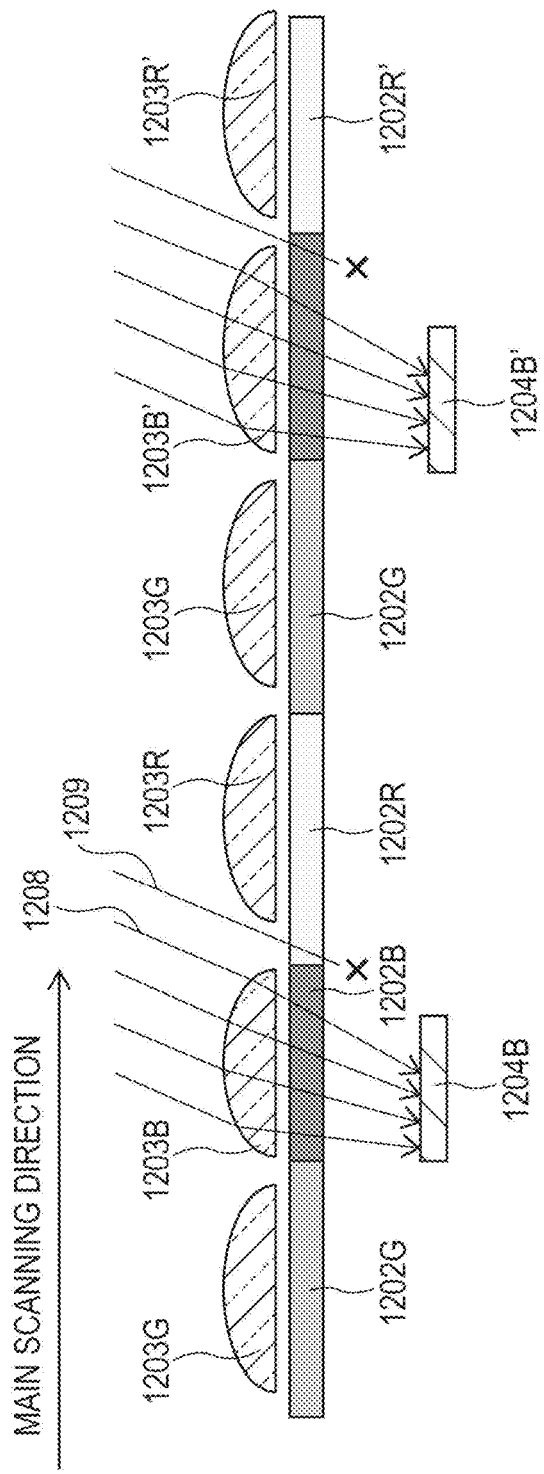

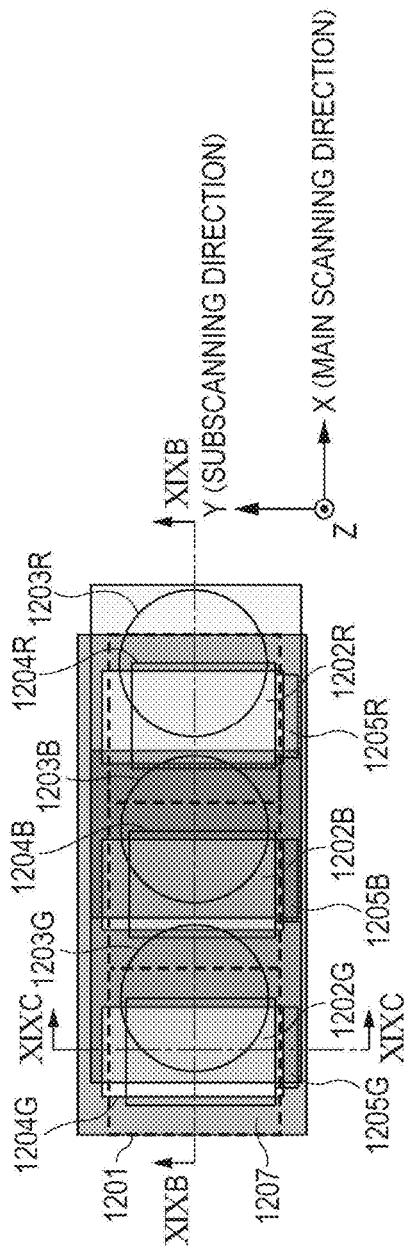
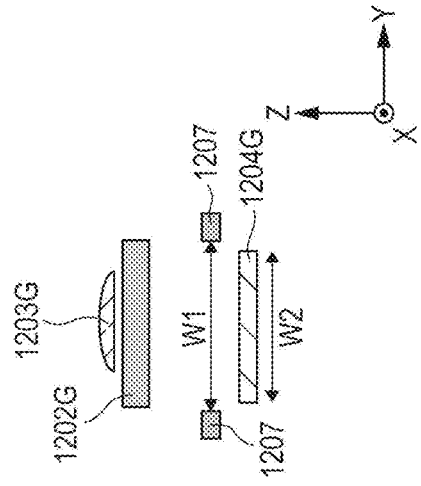
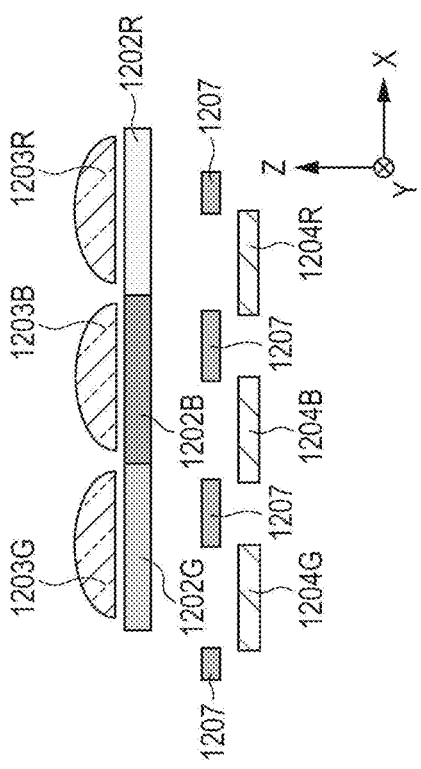

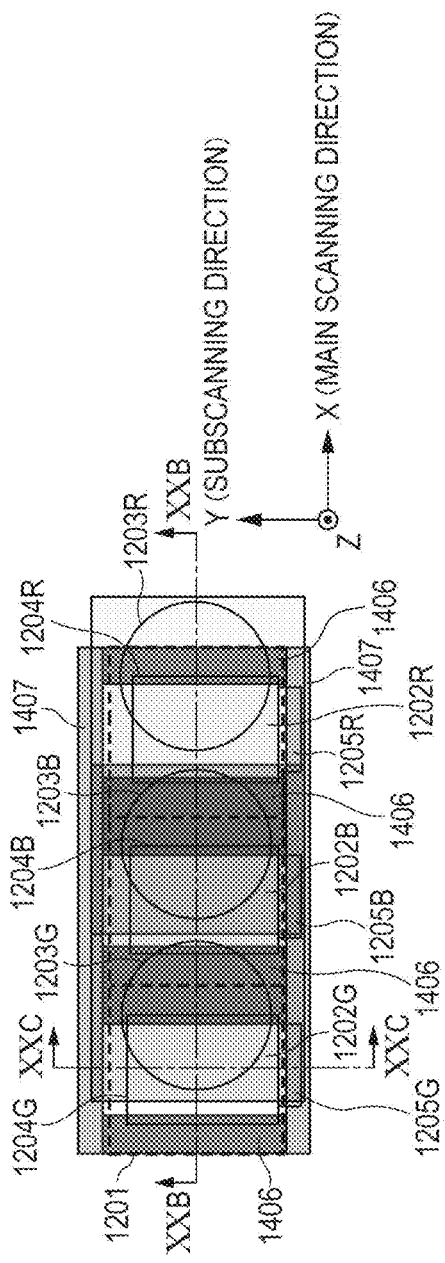
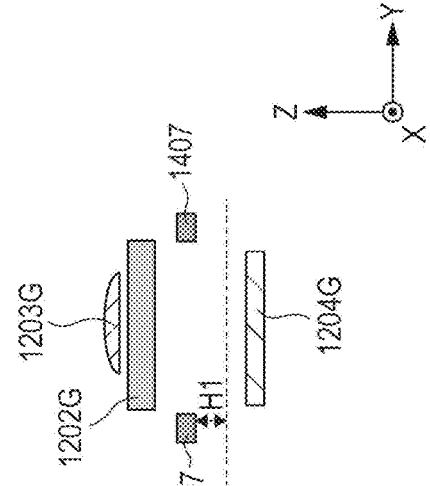
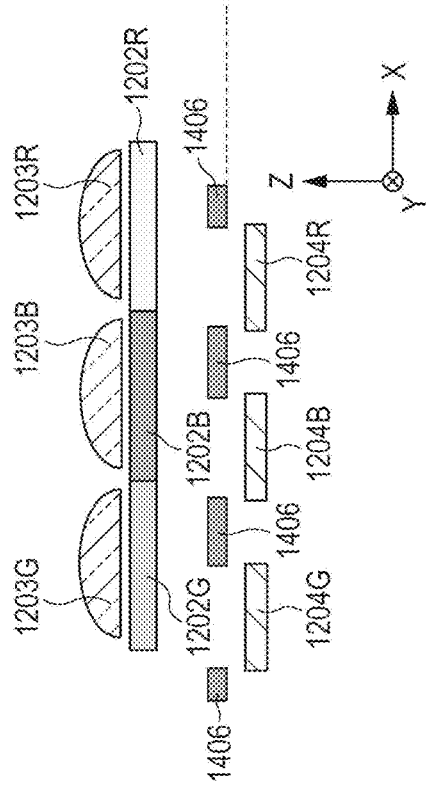
FIG. 20A
FIG. 20C
FIG. 20B

LINE SENSOR, IMAGE READING DEVICE, AND IMAGE FORMING APPARATUS

CROSS-REFERENCE TO RELATED APPLICATIONS

This application is a continuation of Ser. No. 15/629,599 filed Jun. 21, 2017, which is a Continuation of International Patent Application No. PCT/JP2015/085497 filed Dec. 18, 2015, which claims the benefit of International Patent Application No. PCT/JP2014/084433, filed Dec. 25, 2014, both of which are hereby incorporated by reference in their entireties.

TECHNICAL FIELD

The present invention relates to a line sensor including a light-receiving-element row that includes a plurality of light receiving elements that are disposed in a first direction, and including a plurality of transmitting portions that are disposed in correspondence with the plurality of light receiving elements; and to an image reading device and an image forming apparatus to which the line sensor is applied.

BACKGROUND ART

As color original reading means of an original reading device of a copying machine or a multifunction printer, color original reading means that uses an image sensor including R (red), G (green), and B (blue) color filters that are applied on light receiving elements is known. As the image sensor, a CCD (charge coupled device) image sensor and a CMOS (complementary metal oxide semiconductor) image sensor are available.

In reading an original, an original is illuminated with light by using a light source for reading the original, and light reflected from the original is received by the light receiving elements in the image sensor.

A row of light receiving elements in the image sensor is disposed in a main scanning direction for a desired number of pixels, and three rows of light receiving elements are disposed in a sub-scanning direction so as to be apart from each other by a desired interval. The main scanning direction is a direction in which light receiving elements are disposed side by side in a row, and the sub-scanning direction is a direction orthogonal to the main scanning direction.

The R, G, and B color filters each transmit only light having a wavelength corresponding to the color thereof. The R, G, and B filters decompose light reflected from the original into lights corresponding to the colors thereof. The light receiving elements each receive the light corresponding to the color thereof, and make it possible to read a color image (Patent Literature 1).

As an arrangement of color filters in the main scanning direction, an arrangement in which the R, G, and B color filters are periodically disposed in the main scanning direction of a light-receiving-element row is also known (Patent Literature 2).

CITATION LIST

Patent Literature

PTL 1: Japanese Patent Laid-Open No. 11-69083
PTL 2: Japanese Patent Laid-Open No. 8-116402
FIG. 25 is a figure for describing the problems of an image sensor in which R, G, and B color filters are periodically disposed in the main scanning direction as in PTL 2. The letters R, G, and B following reference numerals 20 denoting photodiodes, which are light receiving elements, and following reference numerals 30 denoting color filters denote colors corresponding to the photodiodes and the color filters. When they are described in general independently of the corresponding colors, the symbols R, G, and B are omitted (this will apply below).

Depending upon the structure of a reading unit, incident angles of lights that are incident upon the photodiodes 20 may be inclined with respect to light-receiving-element surfaces. When the incident lights are inclined, a problem called a "mixture of colors" occurs. A "mixture of colors" occurs when light that has been transmitted through a color filter 30 differing from a color filter 30 corresponding to a light receiving element is incident upon the light receiving element. As shown in FIG. 25, a photodiode 20G for receiving green light not only receives light L1 that has been transmitted through a green color filter 30G but also receives light L2 that has been transmitted through a blue color filter 30B adjacent thereto. Therefore, the photodiode 20G receives green light and blue light. As a result, an image having a color tone differing from the color tone of a proper image is read. Such a phenomenon is called a "mixture of colors".

The present invention is made to overcome the above-described problem. It is an object of the present invention to provide a line sensor that is capable of suppressing a "mixture of colors", and an image reading device and an image forming apparatus using the line sensor.

SUMMARY OF INVENTION

To this end, the present invention provides a line sensor that includes light-receiving-element rows each including a plurality of light receiving elements that are disposed in a first direction, and a plurality of transmitting portions that are disposed in correspondence with the plurality of light receiving elements. The plurality of transmitting portions include first transmitting portions that transmit light having a first wavelength and second transmitting portions that transmit light having a wavelength differing from the first wavelength. The plurality of light receiving elements that are disposed in the first direction include first light receiving elements corresponding to the first transmitting portions, and second light receiving elements corresponding to the second transmitting portions, each second light receiving element being disposed towards a center of a corresponding one of the light-receiving-element rows so as to be adjacent to a corresponding one of the first light receiving elements. A center of each first transmitting portion is displaced from a center of a corresponding one of the first light receiving elements in a direction of the center of a corresponding one of the light-receiving-element rows.

Further features of the present invention will become apparent from the following description of exemplary embodiments with reference to the attached drawings.

BRIEF DESCRIPTION OF DRAWINGS

FIG. 11 is a figure for describing the relationship between dispositions of adjacent microlenses.

FIG. 19A is a plan view that describes the relationship between the positions of color filters, microlenses, and wires according to a fourth embodiment.

FIG. 19B is a sectional view of locations along XIXB-XIXB in FIG. 19A.

FIG. 19C is a sectional view of locations along XIXC-XIXC in FIG. 19A.

FIG. 20A is a plan view that describes the relationship between the positions of color filters, the microlenses, vertical wires, and horizontal wires according to a modification of the fourth embodiment.

FIG. 20B is a sectional view of locations along XXB-XXB in FIG. 20A.

FIG. 20C is a sectional view of locations along XXC-XXC in FIG. 20A.

DESCRIPTION OF EMBODIMENTS

Embodiments according to the present invention are described in detail below with reference to the attached drawings.

First Embodiment

Figure 1:
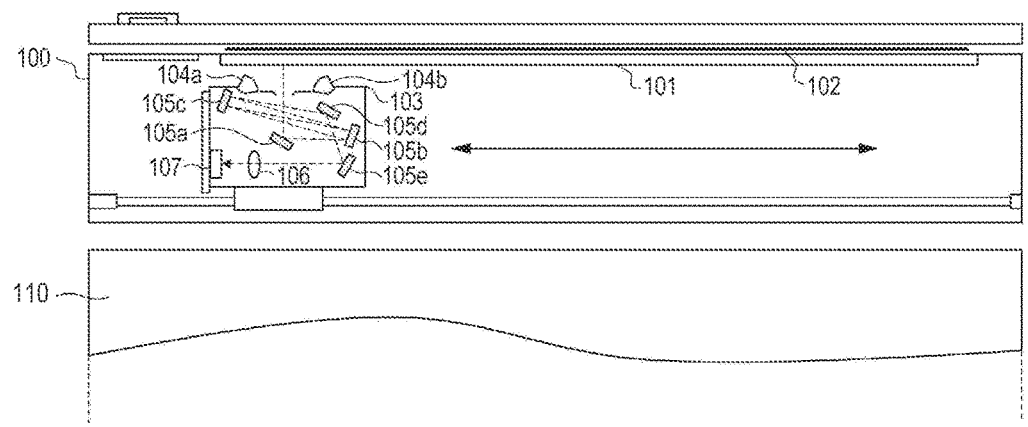
FIG. 1 is a sectional view of an internal structure of an original reading device 100 according to a first embodiment.

FIG. 1 is a sectional view of an internal structure of an original reading device, which is an image reading device. A publicly known image forming unit 110 is provided below the original reading device 100, and the original reading device 100 and the image forming unit 110 constitute an image forming apparatus. An example of the publicly known image forming unit 110 is an electrophotographic image forming unit. The electrophotographic image forming unit forms an image by developing an electrostatic latent image formed on a photoconductor drum into a toner image, and by transferring the toner image to a recording medium, such as paper. The image forming apparatus according to the embodiment is capable of forming an image read by the original reading device 100 on a recording medium by the image forming unit 110.

A sheet (called "original" below) 102, serving as an object to be read, on which an image is formed is placed on an original table glass 101. When a user presses a read start button (not shown), a reading unit 103 moves in a direction of an arrow in FIG. 1 and reads the original 102.

When the reading unit 103 moves in the direction of the arrow, a white LED 104a and a white LED 104b, serving as light emitting units, that are disposed at a top portion of the reading unit 103 are caused to emit light to illuminate the original 102 with the light.

The reading unit 103 is a reading unit of an optical reduction system including the LED 104a and the LED 104b, a plurality of folding mirrors 105a, 105b, 105c, 105d, and 105e, a condensing lens 106, and a CMOS sensor 107. Light from the LED 104a and the LED 104b that illuminates the original 102 is reflected by the original 102. The light reflected from the original 102 is reflected by the folding mirrors 105a, 105b, 105c, 105d, and 105e, and is then condensed on the CMOS sensor 107, which is a line sensor, by the condensing lens 106. The CMOS sensor 107 includes light receiving elements. The light receiving elements photoelectrically convert light incident thereupon, and output an electric signal corresponding to the quantity of incident light.

Figure 2A:
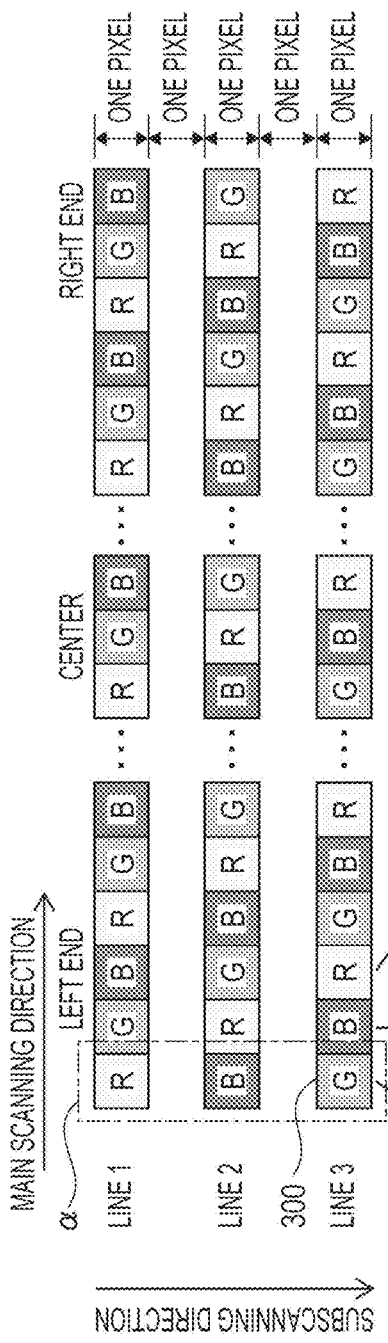
FIG. 2A illustrates an arrangement of color filters at corresponding light-receiving-element rows.
Figure 2B:
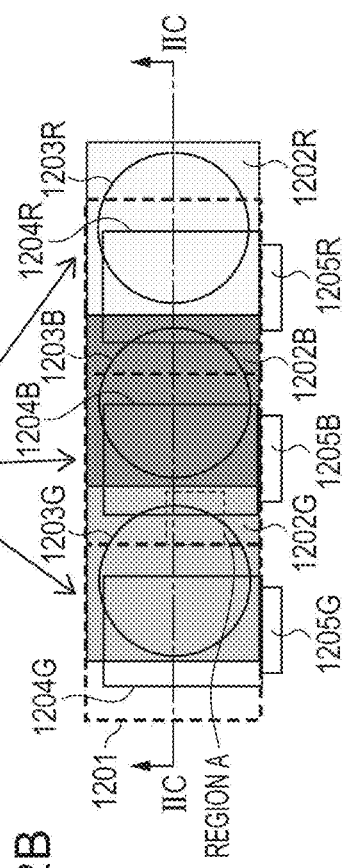
FIG. 2B is a plan view of three pixels, that is, a G pixel, a B pixel, and an R pixel, at a left end portion of line 3 in FIG. 2A.
Figure 2C:
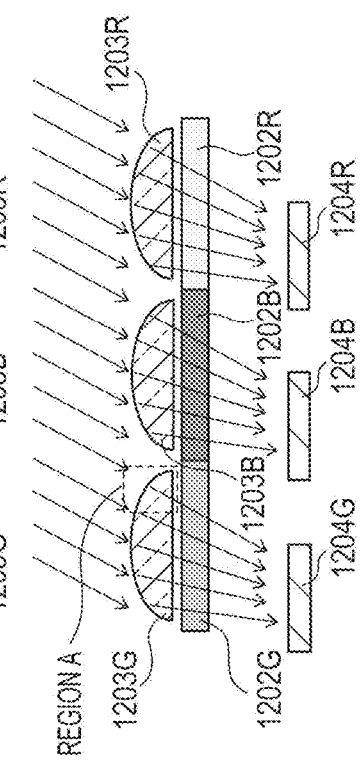
FIG. 2C is a sectional view of locations along IIC-IIC in FIG. 2B.

FIG. 2 is a figure for describing a structure of the CMOS sensor 107. FIG. 2A illustrates an arrangement of color filters for corresponding pixels. FIG. 2B illustrates in detail three pixels, that is, a G pixel, a B pixel, and an R pixel, at a left end portion of line 3. FIG. 2C is a sectional view of locations along IIC-IIC in FIG. 2B. The arrows in FIG. 2C denote incident lights. In the embodiment, one pixel corresponds to one photodiode 1204.

The CMOS sensor 107 includes light-receiving-element rows in which photodiodes 1204 (light receiving elements) are disposed in a main scanning direction, and a plurality of color filters 1202 (transmitting portions) that are disposed in correspondence with the light-receiving-element rows. The photodiodes 1204 for one pixel are smaller than the color filters 1202 for one pixel corresponding to the photodiodes 1204. The CMOS sensor 107 includes a plurality of light-receiving-element rows, that is, line 1, line 2, and line 3. An insulating material, which is called an "interlayer film" made of, for example, SiO (not shown) exists between the color filters 1202 and the photodiodes 1204. As shown in FIG. 2C, microlenses 1203 (condensing portions) are disposed opposite to the photodiodes 1204 with the color filters 1202 interposed therebetween. The microlenses 1203 are disposed in correspondence with the photodiodes 1204, and have the function of condensing light that is incident upon the photodiodes 1204. A cover glass (not shown) exists above the microlenses 1203. Reference numeral 1205 denotes a gate electrode (charge transfer portion) of a pixel transfer transistor. Each gate electrode 1205 is responsible for transferring a photocharge stored in the corresponding photodiode 1204 to a readout circuit. Each gate electrode 1205 is made of polysilicon.

The direction in which the light receiving elements are disposed side by side in a row is a main scanning direction (first direction), and a direction orthogonal to the main scanning direction is a subscanning direction (second direction).

Figure 3:
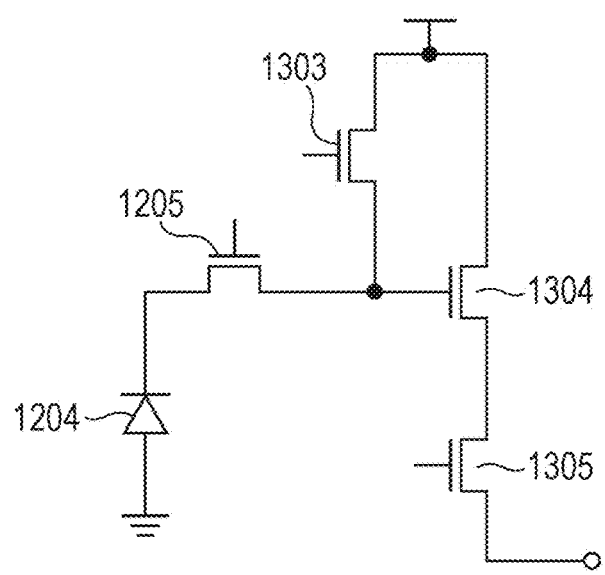
FIG. 3 is an equivalent circuit diagram of a CMOS sensor according to the first embodiment.

FIG. 3 is an equivalent circuit diagram of a unit pixel. The gate electrode 1205 of the pixel transfer transistor is responsible for transferring a photocharge stored in the photodiode 1204 to the readout circuit. The circuit further includes the photodiode 1204, the gate electrode 1205 of the pixel transfer transistor, a reset transistor 1303 that resets a pixel signal, a source follower transistor 1304 that amplifies the pixel signal, and a selection transistor 1305 that reads out the amplified signal.

In line 1, line 2, and line 3, which correspond to the light-receiving-element rows, photodiodes 1204 are disposed for three rows in the subscanning direction and for 7500 pixels in the main scanning direction. In the embodiment, the resolution in the main scanning direction is 600 dpi.

The light-receiving-element rows are disposed apart from each other by an interval corresponding to one pixel in the subscanning direction. Line 2 provides an image at a location that is apart from line 1 by two pixels in the subscanning direction, and line 3 provides an image at a location that is apart from line 1 by four pixels in the subscanning direction.

The color filters 1202 include three types of color filters that transmit different wavelength regions of incident light. The three types of color filters are filters (1202R) that transmit red light, filters (1202G) that transmit green light, and filters (1202B) that transmit blue light.

As shown in FIG. 2, the color filters 1202 at lines 1, 2, and 3 are periodically disposed in the order R→G→B→R→G→B . . . in the main scanning direction. The R color filters, the G color filters, and the B color filters are disposed in a so-called staggered arrangement.

The periodical arrangement R→G→B . . . above in line 2 is shifted with respect to that in line 1 by one pixel in the main scanning direction. The periodical arrangement R→G→B . . . in line 3 is shifted with respect to that in line 1 by two pixels in the main scanning direction. Therefore, when the arrangements of the color filters 1202 are seen in the subscanning direction, an R color filter, a G color filter, and a B color filter exist (refer to α in FIG. 2).

Broken lines 1201 denote ranges indicating unit pixels. The pitch between unit pixels is determined on the basis of the specification of the CMOS sensor, and is usually an equal interval.

Figure 4:
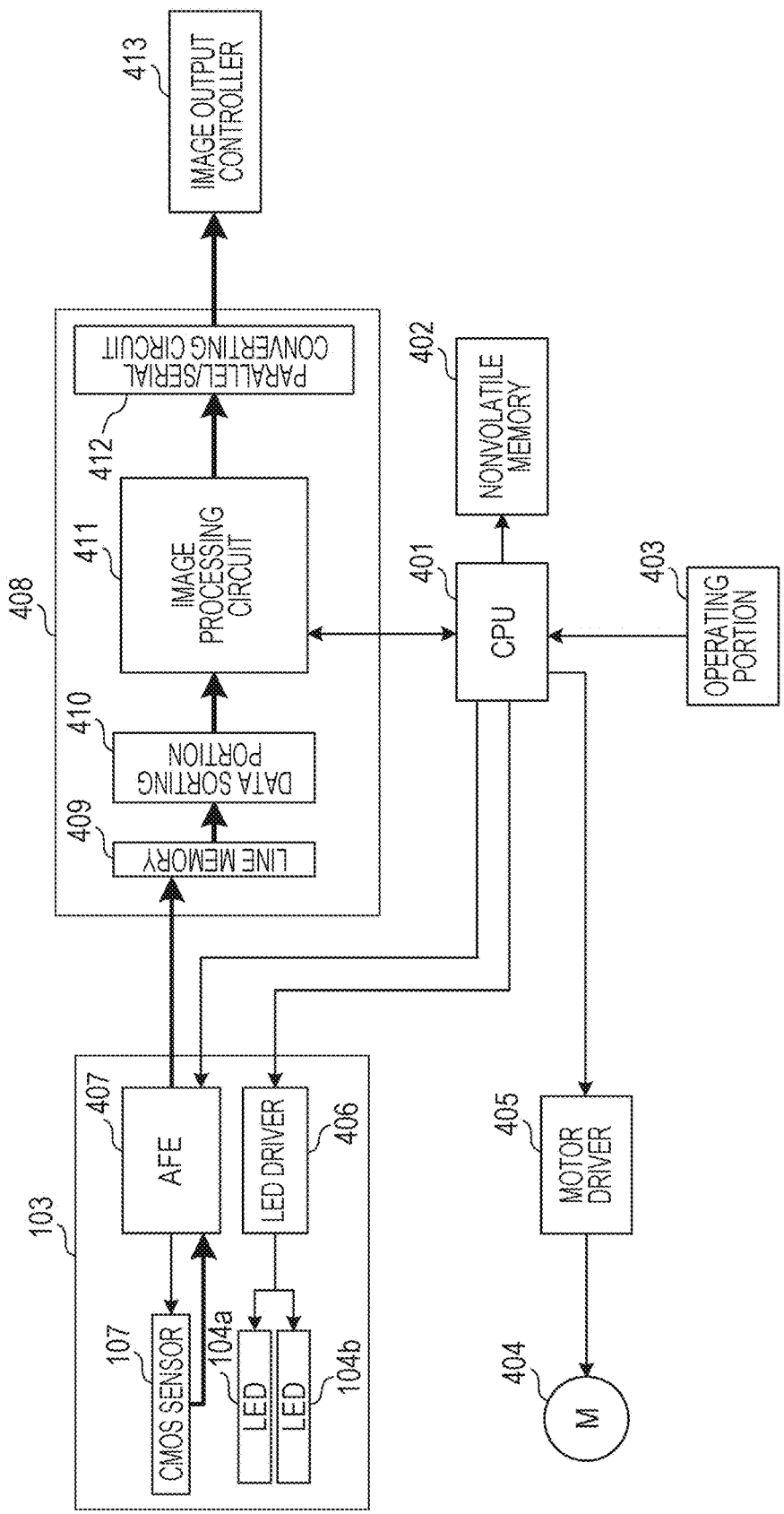
FIG. 4 is a block diagram of a structure of a controlling unit of the original reading device according to the first embodiment.

FIG. 4 is a block diagram of the original reading device 100 according to the embodiment.

A CPU 401 reads out a control program stored in a nonvolatile memory 402, and controls the entire original reading device 100. An operating portion 403 is a user interface that is used by a user to set a copy mode, such as color copy, monochromatic copy, or double-sided copy, and to input a copy start instruction. A motor 404 moves the reading unit 103 in the subscanning direction. A motor driver 405 receives a timing signal from the CPU 401, and supplies exciting current for controlling the rotation of the motor 404.

An LED driver 406 receives a timing signal from the CPU 401, and supplies electric current for causing the white LED 104a and the white LED 104b to emit light.

An IC 407 performs analog processing, such as a sample hold processing, an offset processing, and a gain processing, on an analog voltage signal that is output from the CMOS sensor 107, and converts the voltage signal subjected to the analog processing into digital data (hereunder referred to as "brightness data"). The IC 407 is generally called AFE (analog front end). In the embodiment, the digital data is data of 8 bits (0 to 255).

The operation of an image processing unit 408 is described. Reading data that is output from the AFE 407 is stored in a line memory 409. For every five lines, the line memory 409 holds pieces of reading data that have been read at lines 1, 2, and 3 of the light-receiving-element rows in the CMOS sensor 107.

A data sorting portion 410 sorts R reading data, G reading data, and B reading data. As described above, the CMOS sensor 107 according to the embodiment is such that the R color filters, the G color filters, and the B color filters are disposed in a staggered arrangement. Therefore, with the R reading data, the G reading data, and the B reading data coexisting in one line, the R reading data, the G reading data, and the B reading data are stored in the line memory 409.

As shown in FIG. 2A, lines 1 and 2 are disposed apart from each other by two pixels in the subscanning direction, and lines 1 and 3 are disposed apart from each other by four pixels in the subscanning direction. Therefore, the reading data at line 2 acquired at a certain timing is reading data at a location that is apart from line 1 by two pixels in the subscanning direction, and the reading data at line 3 is reading data at a location that is apart from line 1 by four pixels in the subscanning direction.

Accordingly, the data sorting unit 410 sorts the pieces of reading data acquired from lines 1, 2, and 3, and generates pieces of image data corresponding to the colors, that is, R, G, and B. For example, an R processing is described. The data sorting portion 410 picks up R data from the image data at each of lines 1, 2, and 3 stored in the line memory 409. Since the pieces of reading data at lines 1, 2, and 3 acquired at a certain timing are displaced from each other in the subscanning direction, a processing is performed to eliminate the displacement. That is, regarding the pieces of data acquired at a certain timing, the reading data at line 2 is processed so as to be displaced by two pixels in the subscanning direction, and the reading data at line 3 is processed so as to be displaced by four pixels in the subscanning direction. By such processings, the displacements in the subscanning direction are eliminated. By performing the processing for each color, the pieces of reading data read by the CMOS sensor 107 are no longer displaced from each other in the subscanning direction, so that the pieces of reading data correspond to an image of the original 102.

An image processing circuit 411 performs image processing, such as shading correction processing and filter processing, on the pieces of reading data that have been sorted by the data sorting portion 410. For example, settings of the filters required for the image processing are set in a register in the image processing circuit 411 by the CPU 401 when a power supply is turned on.

A parallel/serial converting circuit 412 converts the pieces of reading data that are pieces of data after the various image processings have been performed and that are output as parallel data from the image processing circuit 411 into serial data. The pieces of reading data converted into serial data are transmitted to an image output controller 413.

Figure 5:
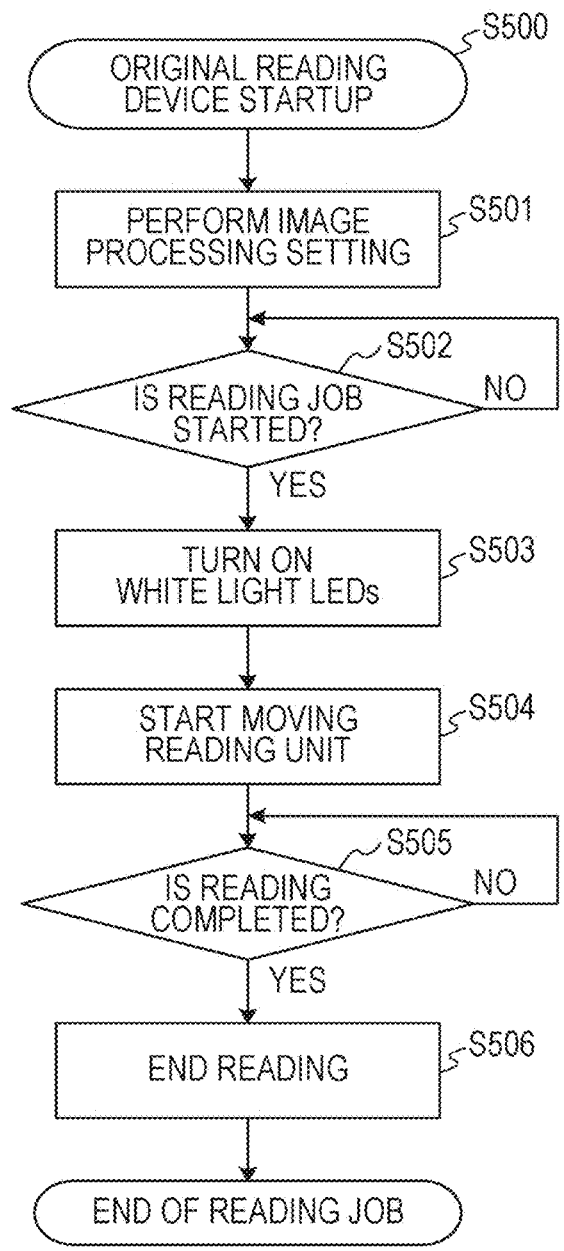
FIG. 5 is a control flow chart of a CPU according to the first embodiment.

FIG. 5 is a control flow chart of the CPU 401 according to the embodiment.

When a user turns on a power supply of the original reading device 100, the CPU 401 performs an initializing operation such as the adjustment of light quantity of LED light sources and a control program startup processing of the original reading device (startup of the original reading device 100: S500).

Next, the CPU 401 sets data corresponding to an image processing setting in the register of the image processing circuit 411 (S501).

Then, the CPU 401 waits for a reading job start instruction from the operating portion 403 (S502).

When the user inputs the reading job start instruction (Y in S502), the CPU 401 causes the white light LEDs 104a and 104b, which are light sources, to emit light (S503). The CPU 401 outputs a control signal to the LED driver 406, so that the LED driver 406 supplies electric current to the LEDs 104a and 104b and causes them to emit light.

Then, the CPU 401 outputs the control signal to the motor driver 405, so that the motor driver 405 drives the motor 404 and moves the reading unit 103 in the subscanning direction (S504).

When the reading is completed (Y in S505), the CPU 401 turns off the LEDs 104a and 104b, and performs control to set the original reading device in a job waiting state.
(Structures of Color Filters, Microlenses, and Gate Electrodes)

Figure 6:
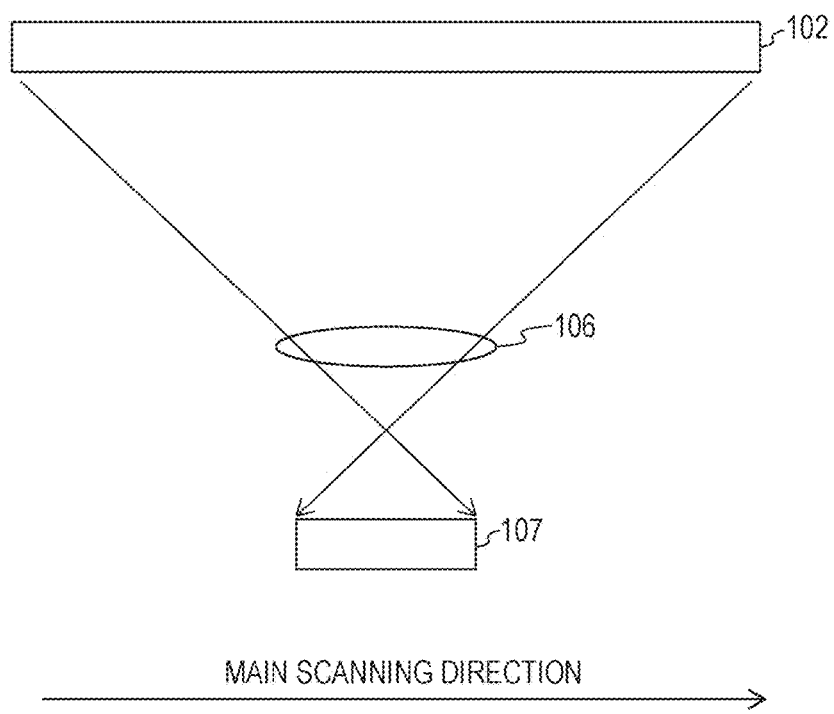
FIG. 6 is a schematic view of a light path when light reflected from an original is incident upon the CMOS sensor in an optical reduction system.

FIG. 6 is a schematic view of a light path when light reflected from the original 102 is incident upon the CMOS sensor 107 in an optical reduction system. For simplifying the explanation, the mirrors are not shown.

Figure 25:
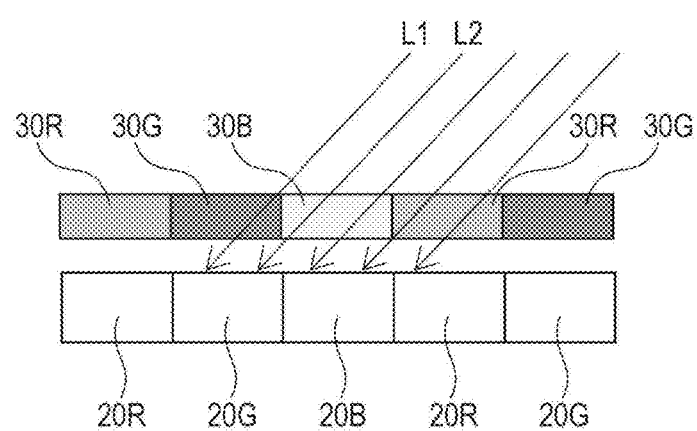
FIG. 25 is a view for describing a mixture of colors.

In the optical reduction system, the length of the CMOS sensor 107 in the main scanning direction is less than the length of the original 102 that is read in the main scanning direction. As shown in FIG. 6, at a central portion of the light-receiving-element rows of the CMOS sensor 107, light from the original is substantially perpendicularly incident upon the CMOS sensor 107, whereas, at end portions thereof, the light from the original is obliquely incident upon the CMOS sensor 107. As described above, in a line sensor in which different color filters are disposed at light-receiving-element rows, when incident light is inclined, the problem of a mixture of colors occurs (see FIG. 25).

In the embodiment, in order to prevent incident light upon the CMOS sensor 107 from becoming inclined, the center of each color filter 1202 is displaced from the center of the photodiode 1204 corresponding to the color filter.

Figure 7:
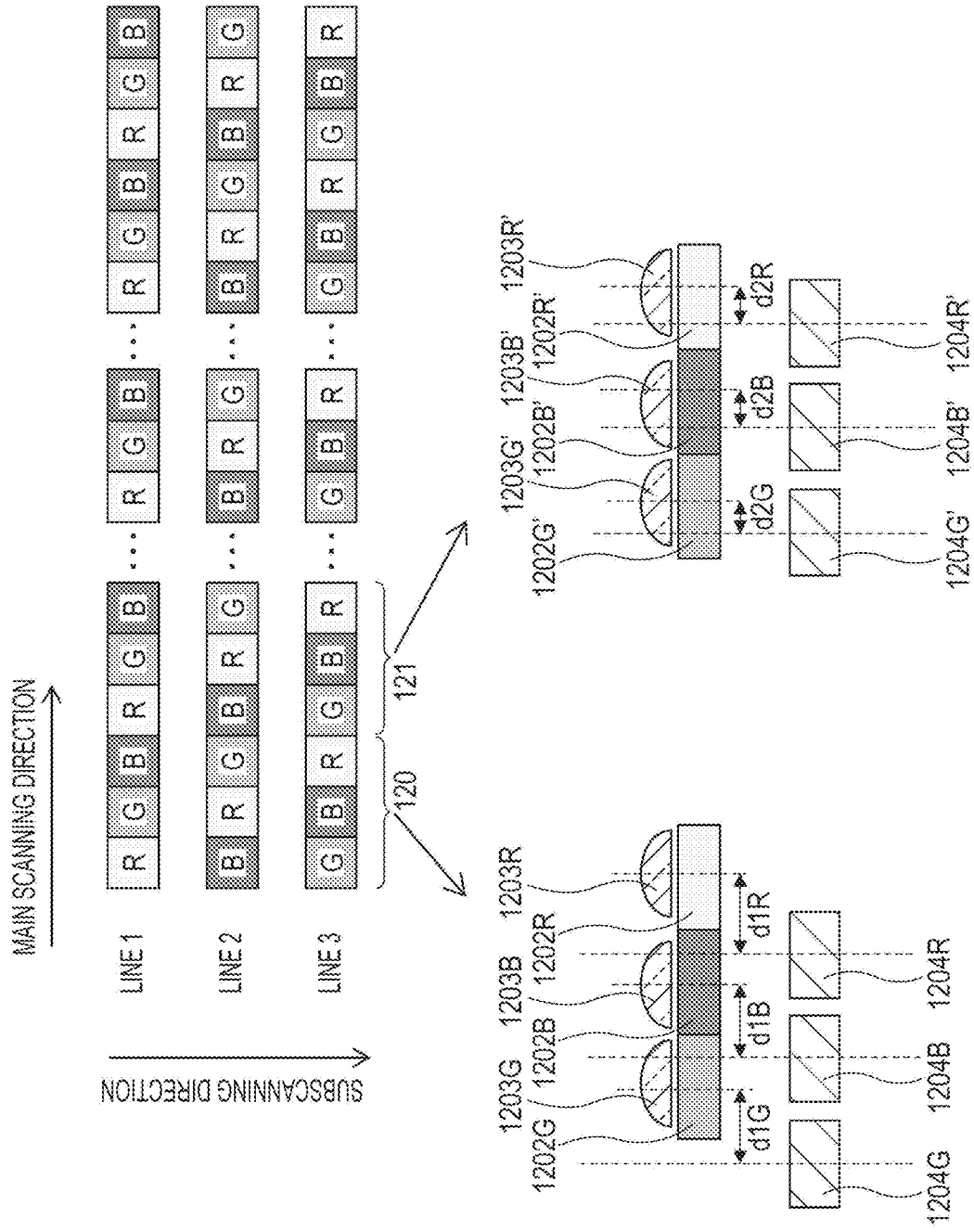
FIG. 7 is a figure for describing the amounts of displacements of color filters and microlenses.

This is described by using FIG. 7. The center of each color filter 1202 is disposed so as to be displaced towards the center of the corresponding light-receiving-element row in the main scanning direction from the center of the photodiode 1204 corresponding to the color filter. The center of each microlens 1203 is disposed so as to be displaced towards the center of the corresponding light-receiving-element row in the main scanning direction from the center of the photodiode 1204 corresponding to the microlens 1203.

Each light-receiving-element row includes photodiodes 1204G (first light receiving elements), photodiodes 1204B (second light receiving elements), and photodiodes 1204R (third light receiving elements).

The photodiodes 1204G are photodiodes corresponding to the color filters 1202G (first transmitting portions). The photodiodes 1204B are photodiodes corresponding to the color filters 1202B (second transmitting portions) that are provided adjacent to the photodiodes 1204G towards the center of the corresponding light-receiving-element row. The photodiodes 1204R are photodiodes corresponding to the color filters 1202R (third transmitting portions) that are provided adjacent to the photodiodes 1204B towards the center of the corresponding light-receiving-element row.

The center of each color filter 1202G is disposed so as to be displaced towards the center of the corresponding light-receiving-element row in the main scanning direction from the center of the corresponding photodiode 1204G. The center of each color filter 1202B is disposed so as to be displaced towards the center of the corresponding light-receiving-element row in the main scanning direction from the center of the corresponding photodiode 1204B. The center of each color filter 1202R is disposed so as to be displaced towards the center of the corresponding light-receiving-element row in the main scanning direction from the center of the corresponding photodiode 1204R.

The plurality of microlenses include microlenses 1203G (first condensing portions), microlenses 1203B (second condensing portions), and microlenses 1203R (third condensing portions).

The microlenses 1203G are microlenses corresponding to the photodiodes 1204G. The microlenses 1203B are microlenses corresponding to the photodiodes 1204B. The microlenses 1203R are microlenses corresponding to the photodiodes 1204R. The center of each microlens 1203G is disposed so as to be displaced towards the center of the corresponding light-receiving-element row in the main scanning direction from the center of the corresponding photodiode 1204G. The center of each microlens 1203B is disposed so as to be displaced towards the center of the corresponding light-receiving-element row in the main scanning direction from the center of the corresponding photodiode 1204B. The center of each microlens 1203R is disposed so as to be displaced towards the center of the corresponding light-receiving-element row in the main scanning direction from the center of the corresponding photodiode 1204R. In the embodiment, the center of each color filter 1202 and the center of its corresponding microlens 1203 are aligned.

In the embodiment, the reading unit is a reading unit of an optical reduction system. Light that is incident upon the left end portion of the CMOS sensor 107 is inclined towards the center of the light-receiving-element row in the main scanning direction as shown in FIG. 2C. In the embodiment, the center of each color filter 1202 and the center of each microlens 1203 are disposed so as to be displaced towards the center of the corresponding light-receiving-element row in the main scanning direction from the center of the corresponding photodiode 1204. Therefore, each photodiode 1204 is capable of receiving light that has been transmitted through the color filter 1202 and the microlens 1203 corresponding to the photodiode 1204. Consequently, it is possible to mitigate the problem of a mixture of colors.

The amounts of displacement of the color filters 1202 and the microlenses 1203 are described by using FIG. 7. A position 120 in FIG. 7 corresponds to a first position, and a position 121, which is situated closer to the center of the corresponding light-emitting-element row than the first position is, corresponds to a second position. Light that is incident upon the CMOS sensor 107 is inclined by a larger amount towards the end portions of the light-receiving-element rows and is inclined by a smaller amount and becomes closer to a perpendicular orientation towards the central portion of the light-receiving-element rows. Therefore, the amount of displacement of the center of each color filter 1202 (and the center of each microlens 1203) in a center direction of the corresponding light-emitting-element row from the center of the corresponding photodiode 1204 is large towards the end portions of the corresponding light-receiving-element row and is small towards the center of the corresponding light-receiving-element row.

d1G, d1B, and d1R denote that the amounts by which the centers of color filters 1202G, 1202B, and 1202R are displaced from the centers of corresponding photodiodes 1204G, 1204B, and 1204R at the first position.

d2G, d2B, and d2R denote the amounts by which the centers of color filters 1204G', 1204B', and 1204R' are displaced from the centers of the corresponding photodiodes 1204G', 1204B', and 1204R' at the second position.

The amounts of displacement are such that d1G>d1B>d1R>d2G>d2B>d2R.

That is, the amount of displacement between the center of the color filter 1202G and the center of the photodiode 1204G at the first position is larger than the amount of displacement between the center of the color filter 1202G' and the center of the photodiode 1204G' at the second position. Similarly, the amount of displacement between the center of the microlens 1203G and the center of the photodiode 1204G at the first position is larger than the amount of displacement between the center of the microlens 1203G' and the center of the photodiode 1204G' at the second position. When viewed at the same first position, the amount of displacement between the center of the color filter 1202G and the center of the photodiode 1204G is larger than the amount of displacement between the center of the color filter 1202B and the center of the photodiode 1204B. The amount of displacement between the center of the color filter 1202B and the center of the photodiode 1204B is larger than the amount of displacement between the center of the color filter 1202R and the center of the photodiode 1204R.

By this, it is possible to provide an optimum displacement amount of the color filters 1202 (microlenses 1203) in terms of a mixture of colors in accordance with the illumination angle of light with respect to the light-receiving-element rows.

Figure 8:
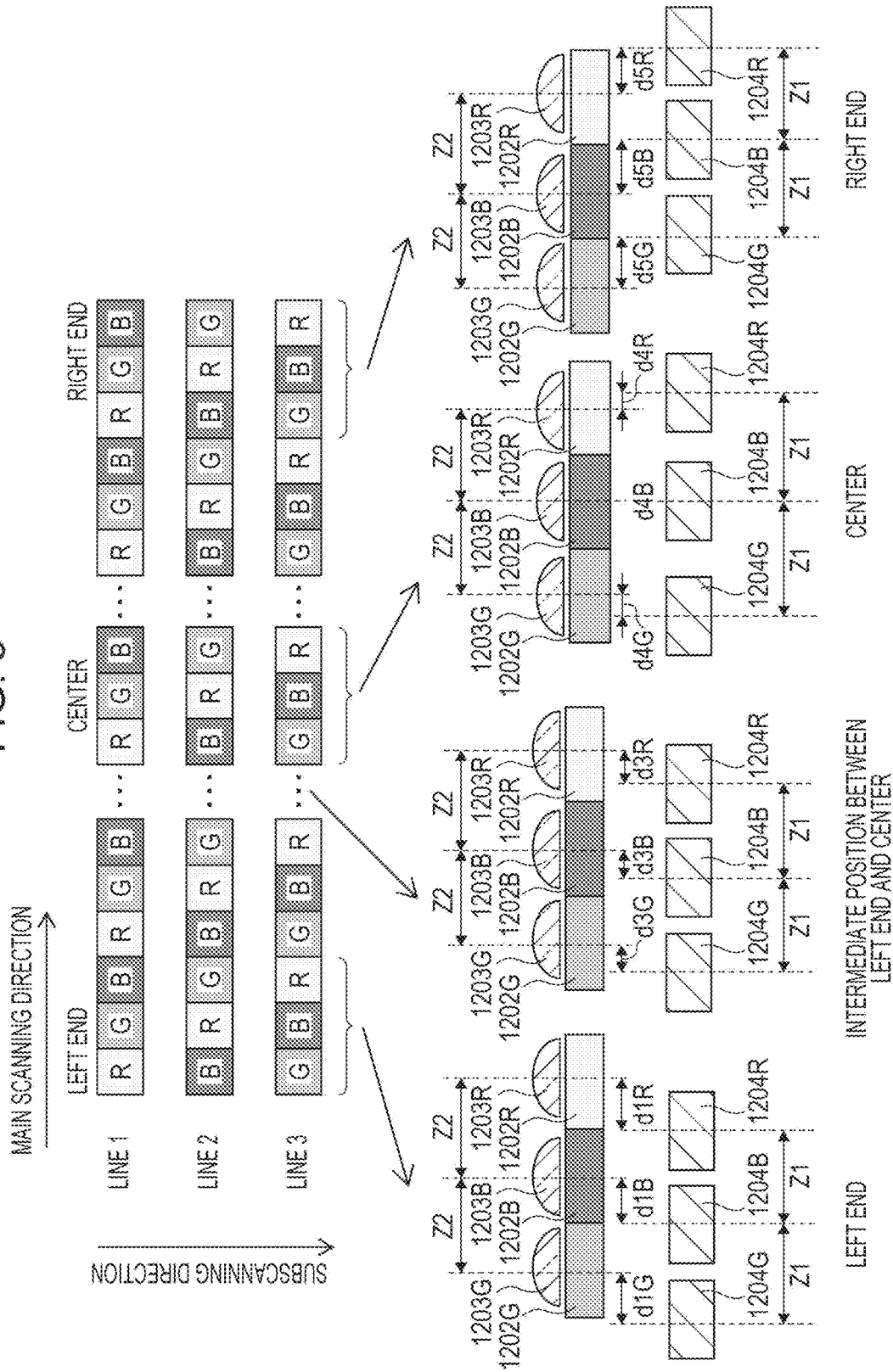
FIG. 8 is a figure for describing the relationship between the positions of the color filters and the positions of the photodiodes at a central portion, a left end portion, and a right end portion of a light-receiving-element row.

In the embodiment, as shown in FIG. 8, a pitch interval Z2 between color filters is made smaller by a predetermined proportion than a pitch interval Z1 between photodiodes (for example, $0.99 \times Z1 = Z2$). At the center of each light-receiving-element row in the main scanning direction, the center of the color filter 1202B and the center of the photodiode 1204B are aligned. Since the pitch interval Z2 between the color filters is less than the pitch interval Z1 between pixels, the amounts of displacement of the color filters 1202 and the microlenses 1203 become larger towards the end portions of the corresponding light-receiving-element rows in the main scanning direction. That is, on the left end side from the center of each light-receiving-element row in the main scanning direction, d1G>d1B>d1R d3G>d3B>d3R>d4G. On the right end side from the center of each light-receiving-element row in the main scanning direction, d5R>d5B>d5G>d4R. The amounts of displacements of the color filters 1202 and the microlenses 1203 are proportional to the distances from the central portion to their positions. The amount of displacement of the pixels that are positioned midway between the left end portion and the central portion of the corresponding light-receiving-element row is approximately half of that of the pixels at the left end portion. That is, $0.5 \times d1G \approx d3G$, $0.5 \times d1B \approx d3B$, $0.5 \times d1R \approx d3R$. Although the case for the left end of the light-receiving-element row is described, similarly, on the right from the center of each light-receiving-element row, the color filters 1202 are disposed so as to be displaced towards the center of the corresponding light-receiving-element row in the main scanning direction from the corresponding photodiodes 1204.

Next, connection between each photodiode 1204 and its corresponding gate electrode 1205 is described. Each photodiode 1204 and its corresponding gate electrode 1205 are connected to each other in the subscanning direction, and are disposed within a range 1201 denoting one pixel (see FIG. 2B).

Figure 9A:
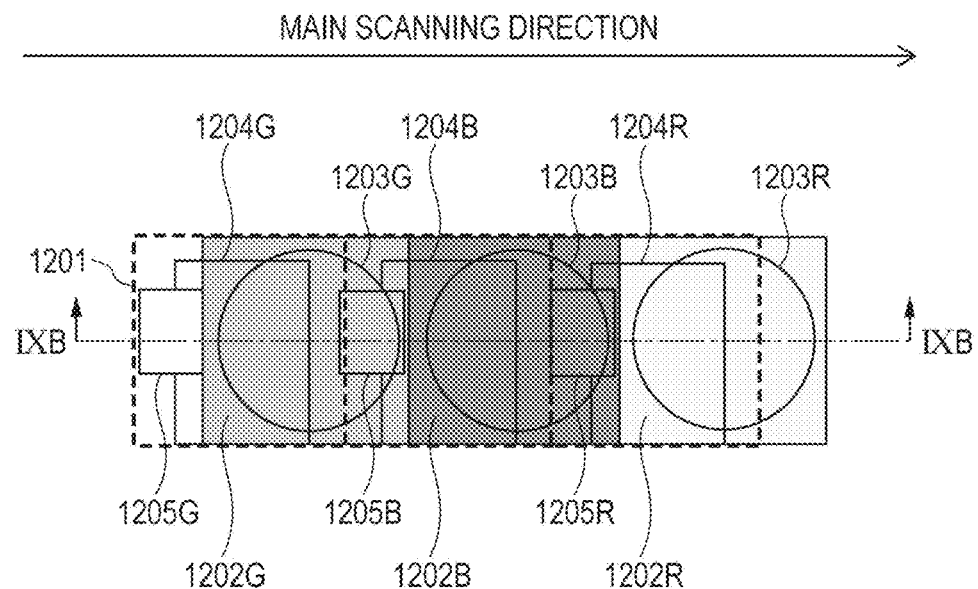
FIG. 9A is an explanatory view when gate electrodes are disposed in the main scanning direction.
Figure 9B:
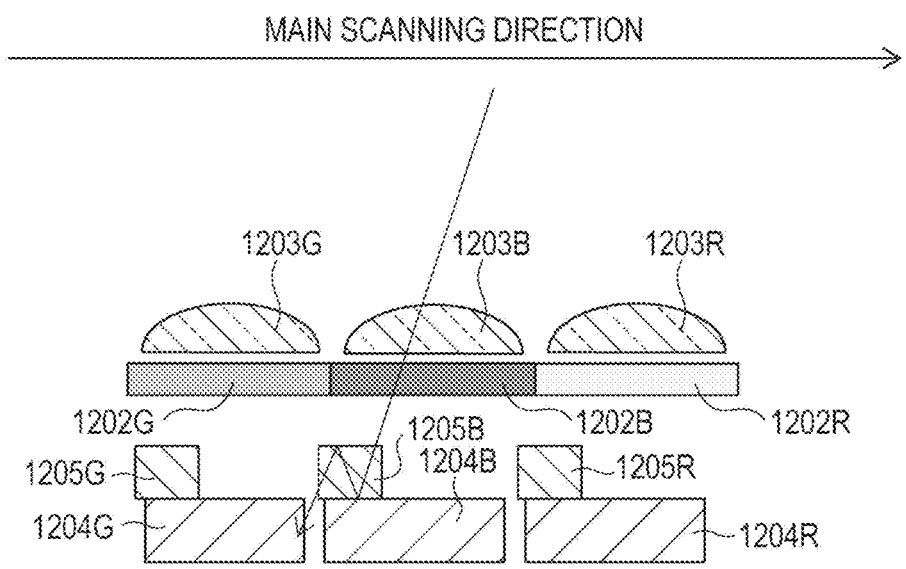
FIG. 9B is a sectional view of locations along IXB-IXB in FIG. 9A.

In the embodiment, polysilicon, which is a highly refractive material, is used as the material of each gate electrode 1205. Therefore, each gate electrode 1205 is not disposed in the main scanning direction. The case in which each gate electrode 1205 is disposed in the main scanning direction is shown in FIG. 9A. FIG. 9B is a sectional view of locations along IXB-IXB in FIG. 9A. For the explanation, only one incident light beam is shown. As shown in FIG. 9B, the difference between the refractive index of polysilicon and an interlayer film may cause light incident upon a gate electrode 1205 of a pixel transfer transistor to changes its path, and to be incident upon a unit pixel of a different color. As a result, the problem of a mixture of colors occurs.

In the embodiment, it is possible to suppress a mixture of colors by disposing the gate electrodes 1205 of the pixel transfer transistors in the subscanning direction without disposing them between unit pixels in the main scanning direction. This is highly effective in suppressing a mixture of colors particularly in the CMOS sensor in which the R color filters, the G color filters, and the B color filters are arranged adjacent to each other.

Figure 10A:
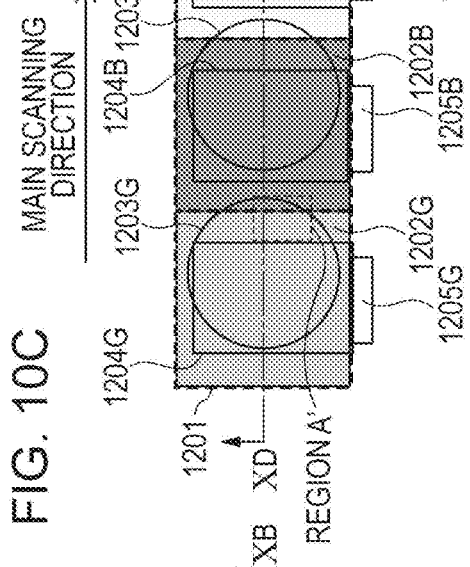
FIG. 10A illustrates the relationship between the positions of color filters and the positions of microlenses in a comparative example (left end).
Figure 10B:
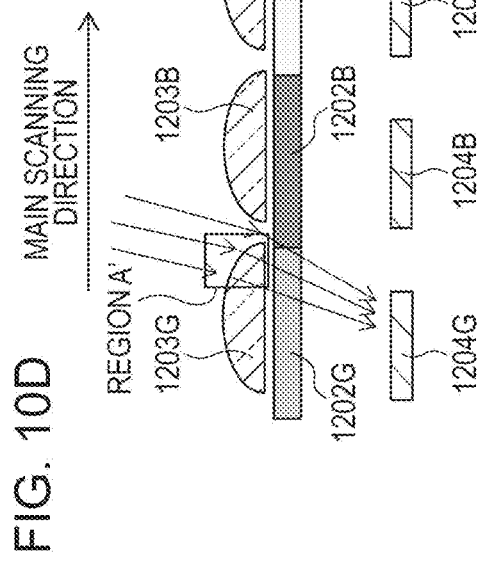
FIG. 10B is a sectional view of locations along XB-XB in FIG. 10A.
Figure 10C:
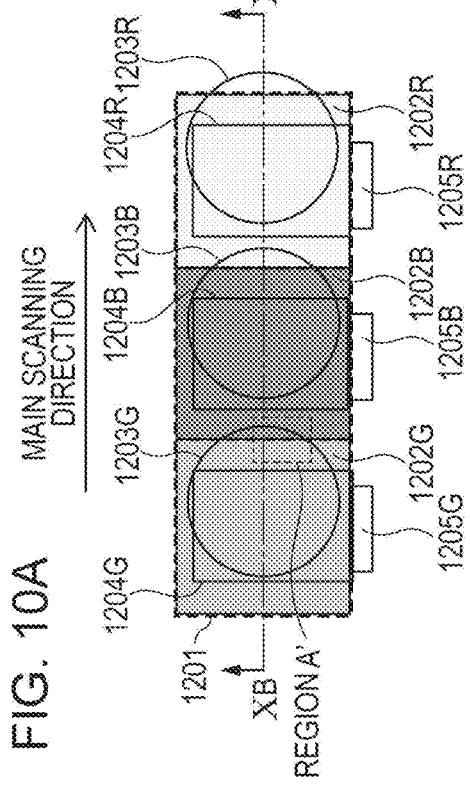
FIG. 10C illustrates the relationship between the positions of color filters and the positions of microlenses in the comparative example (near the center).
Figure 10D:
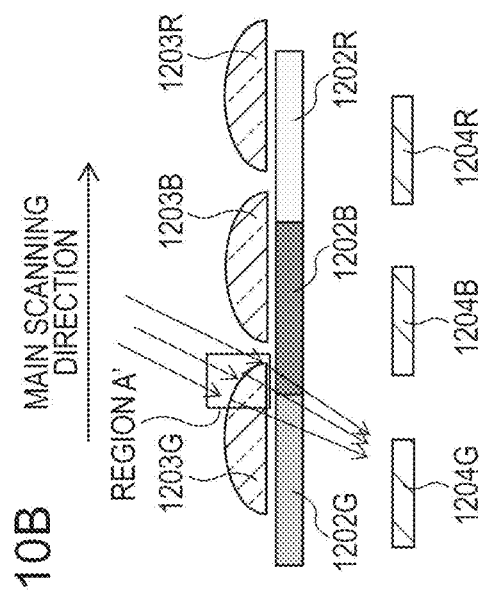
FIG. 10D is a sectional view of locations along XD-XD in FIG. 10A.

In the embodiment, the microlenses 1203G, the microlenses 1203B, and the microlenses 1203R are along with the color filters 1202G, 1202B, and 1202R displaced towards the center of the CMOS sensor. By virtue of this structure, a mixture of colors and variations in sensitivity are suppressed. This is described by using FIGS. 2B and 2C, and FIGS. 10A to 10D. FIGS. 2B and 2C show the relationship between the positions of the color filters and the positions of the corresponding microlenses 1203 (plan view) in the embodiment. FIGS. 10A to 10D show the relationship between the positions of color filters 1202 and the positions of corresponding microlenses 1203 in a comparative example. The color filters 1202 in FIGS. 10A to 10D are disposed in correspondence with the photodiodes 1204, and the microlenses 1203 are disposed so as to be displaced from the corresponding photodiodes 1204. The displacement amounts of the microlenses 1203 are large towards an end portion of a light-receiving-element row and become smaller towards a central portion. FIGS. 10A and 10B show the left end portion of the light-receiving-element row, and FIGS. 10C and 10D show the vicinity of the central portion of the light-receiving-element row. As figures showing the left end of the light-receiving-element row, FIG. 10A corresponds to FIG. 2B, and FIG. 10B corresponds to FIG. 2C. FIG. 10B is a sectional view of locations along XB-XB in FIG. 10A. FIG. 10D is a sectional view of locations along XD-XD in FIG. 10C. In FIG. 2B and FIG. 10A, incident light beams being transmitted through region A or A' are considered. The regions A and A' have the same area, and are situated at locations that correspond with each other with respect to the microlenses 1203G. As shown in FIG. 2C, when the color filters 1202 and the microlenses 1203 are disposed so as to be displaced from the corresponding photodiodes 1204 as in the embodiment, light that is transmitted through the region A is transmitted through the single color filter 1202G. In contrast, as shown in FIG. 10B, light that is transmitted through the region A' is transmitted through both the color filter 1202G and the color filter 1202B. Therefore, when the color filters 1202, the microlenses 1203, and the photodiodes 1204 are disposed as in the comparative example, the problem of a mixture of colors occurs even though the light has been transmitted through the microlenses. In contrast, in the embodiment, it is possible to suppress the occurrence of such a problem.

Further, FIGS. 10A and 10B and FIGS. 10C and 10D are compared. The amounts of displacements between the microlenses 1203 and the corresponding color filters 1202 (and the corresponding photodiodes 1204) are smaller near the central portion than at the left end portion of the light-receiving-element row. Therefore, the proportion of the region A' that G and B occupy differ. Consequently, the degree of a mixture of colors at an end portion differs from that near the central portion. Further, when light is incident upon the vicinity of the gate electrode 1205 in the region A', the light may be incident upon the gate electrode 1205. In the embodiment, polysilicon, which is a highly refractive material, is used as the material of each gate electrode 1205, and polysilicon is highly dependent upon wavelength. Therefore, when the proportion of light that is transmitted through the G color filter 1202 and the proportion of light that is transmitted through the B color filter 1202 differ from each other, the proportions of light that are absorbed and refracted by the gate electrodes 1205 also differs, as a result of which pixel sensitivity variations at the left end and the vicinity of the center become large. In contrast, in the embodiment, it is possible to suppress the occurrence of such a problem.

In the embodiment, the color filters 1202G are described as the first transmitting portions, the color filters 1202B are described as the second transmitting portions, and the color filters 1202R are described as the third transmitting portions. The relationship between the colors and the color filters is a relative relationship, and is not limited thereto. The color filters 1202B may be the first transmitting portions, or the color filters 1202R may be the first transmitting portions. The first light receiving elements and the first condensing portions are similarly in a relative relationship with the colors of the color filters.

(Description of Disposition of Microlenses)

Figure 12:
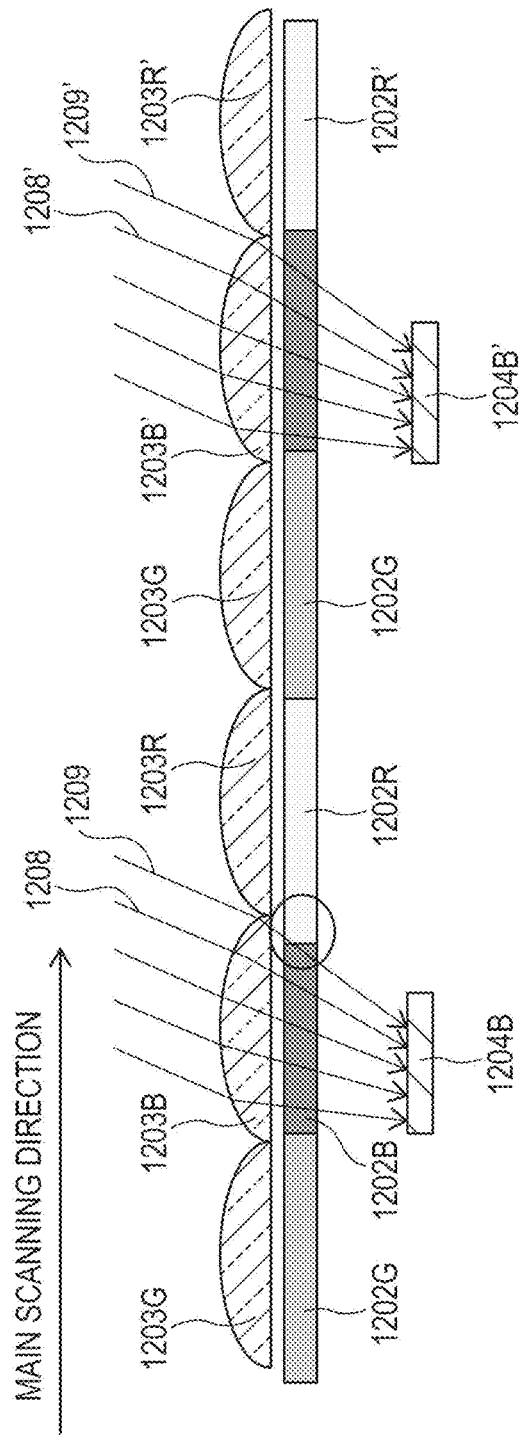
FIG. 12 is a figure for describing the relationship between dispositions of adjacent microlenses.

By using FIGS. 11 and 12, the effects resulting from disposing adjacent microlenses 1203 apart from each other are described.

FIG. 11 is a simplified view of FIG. 2C for describing the effects resulting from the disposition of the microlenses 1203. FIG. 12 shows that adjacent microlenses 1203 are in contact with each other.

When the color filters 1202 are disposed for three colors, that is, R, G, and B, in one line as in the embodiment, the color filters 1202 are formed for R, G, and B. Therefore, in the manufacturing process, the sizes of the color filters for the corresponding colors tend to differ from each other. When the R, G, and B color filters are manufactured in the main scanning direction, since the R, G, and B color filters are made of different materials, their process steps differ from each other. For example, the step of forming the R color filters, the step of forming the G color filters, and the step of forming the B color filters are successively performed. Therefore, alignment errors when the filters of the corresponding colors are manufactured and pattern size errors caused by photolithography occur during manufacturing, as a result of which the sizes of the R, G, and B color filters may differ slightly. In contrast, since the microlenses 1203 are made of the same material and in the same process step, alignment errors and pattern size errors are unlikely to occur. Therefore, it is possible to stably manufacture the microlenses 1203 with the same size, and to dispose the microlenses 1203 at the same interval when they are disposed with respect to the color filters. As a result, as shown in FIG. 11, the sizes of the color filters 1202 differ from the sizes of the microlenses 1203.

Therefore, the position of a boundary between adjacent color filters tend to differ from the position of each corresponding microlens 1203. When only one color exists in the same line, the problem that the sizes of color filters of corresponding colors differ from each other does not occur. In the Bayer arrangement in which two colors are disposed in the same line, since the number of colors is smaller than the case in which color filters of three colors exist at the same line as in the embodiment, the above-described problem is unlikely to occur.

As in FIG. 12, incident light 1209 at an end portion of a microlens 1203 is transmitted through an end portion of the corresponding color filter 1202. As mentioned above, if the position of the boundary portion between color filters 1202 varies with respect to the position of the corresponding microlens 1203, the colors at the color filters through which the incident light that has been transmitted through the end portion of the microlens 1203 is transmitted varies. The case of incident light that is transmitted through an end portion of a microlens 1203B is described by using FIG. 12. Incident light 1208 is transmitted through the blue color filter 1202B, and the incident light 1209 is transmitted through a red color filter 1202R. In contrast, incident light 1208' and incident light 1209' are both transmitted through a blue color filter 1202B'. In this way, the quantities of light transmitted through the color filter 1202B (1202B') differ, as a result of which the problem of a mixture of colors occurs.

In the embodiment, gaps are formed between the microlenses 1203 to prevent light that has been condensed by the microlenses 1203 from being transmitted through adjacent color filters 1202. As shown in FIG. 11, the incident light 1208 and incident light 1208' are transmitted through the blue color filters 1202B. The lights (the incident light 1209 and incident light 1209' in FIG. 11) that are not transmitted through the corresponding microlenses 1203 are blocked by, for example, wires provided between the microlenses, and do not reach the corresponding photodiodes 1204. Therefore, the effect of the problem of a mixture of colors is small.

In the embodiment, by providing gaps between the microlenses 1203, the occurrence of the problem of a mixture of colors is suppressed in the structure in which color filters 1202 of different colors are disposed in one line. In particular, with regard to such problems, the larger the number of types of colors of color filters 1202 that are provided in one line, the greater the tendency with which manufacturing variations occur. Therefore, when color filters of three colors exist in one line as in the embodiment, the effect is large. In addition, by displacing the microlenses 1203 and the color filters 1202, it is possible to reduce the quantities of light from color filters 1202 of different colors at the vicinity of the incident light 1209, so that the occurrence of the problem of a mixture of colors can be effectively suppressed.

Second Embodiment

A second embodiment according to the present invention is described with reference to FIGS. 13A and 13B. The second embodiment is the same as the first embodiment except that the shapes of microlenses 1203 differ. Therefore, the same structural features are not described below.

Figure 13A:
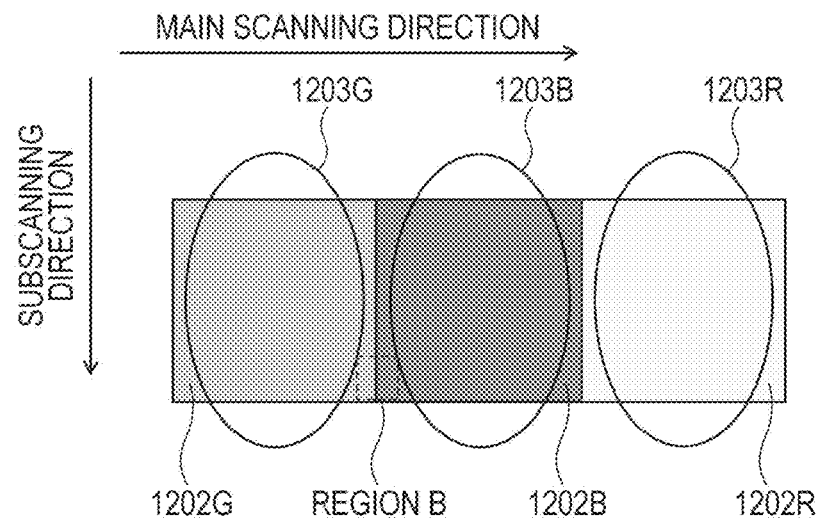
FIG. 13A illustrates elliptical microlenses according to a second embodiment.

FIG. 13A is a plan view of the embodiment.

Photodiodes 1204 and gate electrodes 1205 are not shown. The microlenses 1203 according to the second embodiment have elliptical shapes, and have large curvature radii in the subscanning direction compared to those in the main scanning direction when the microlenses 1203 are viewed in a direction orthogonal to the main scanning direction and the subscanning direction.

Figure 13B:
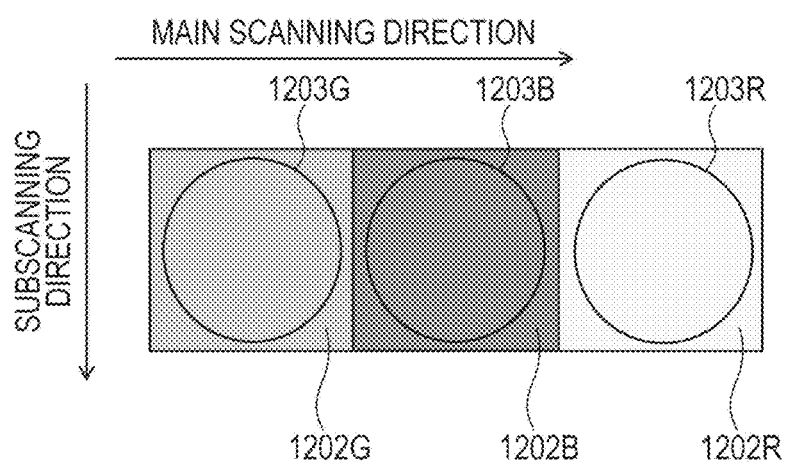
FIG. 13B illustrates perfectly circular microlenses.

FIG. 13B illustrates an example in which perfectly circular microlenses 1203 whose curvature radii are the same in the main scanning direction and in the subscanning direction are disposed. By virtue of the structure shown in FIG. 13A, larger regions are covered by the microlenses 1203 than in FIG. 13B.

Figure 14:
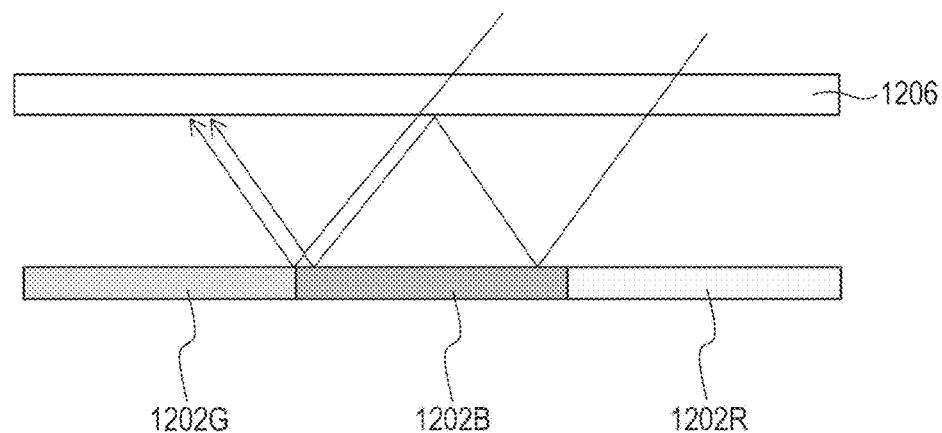
FIG. 14 is a figure for describing multiple interaction of incident light.

The effects are described. FIG. 14 is a figure for describing multiple interaction of incident lights, and illustrates only color filters 1202 and a cover glass 1206 that is provided above the color filters 1202. Parts of light incident upon flat regions of the color filters 1202 that are not covered by the spherical microlenses 1203 are reflected by surfaces of the corresponding color filters 1202. The reflected light is reflected between each color filter 1202 and the cover glass 1206, as a result of which a ghost is generated. When a ghost is generated, an image differing from a proper image of an original is read as a reading image.

Therefore, it is better to make the areas of the microlenses 1203 as large as possible in relation to the areas of the color filters 1202. Since the microlenses are provided adjacent to each other, there is a limit as to how large the microlenses can be made in the main scanning direction. In contrast, such a limit does not exist regarding the sizes of the microlenses in the subscanning direction. Therefore, by forming the microlenses with a small diameter in the main scanning direction and with a large diameter in the subscanning direction, the areas of the microlenses 1203 can be made large in relation to the areas of the color filters 1202.

Figure 15:
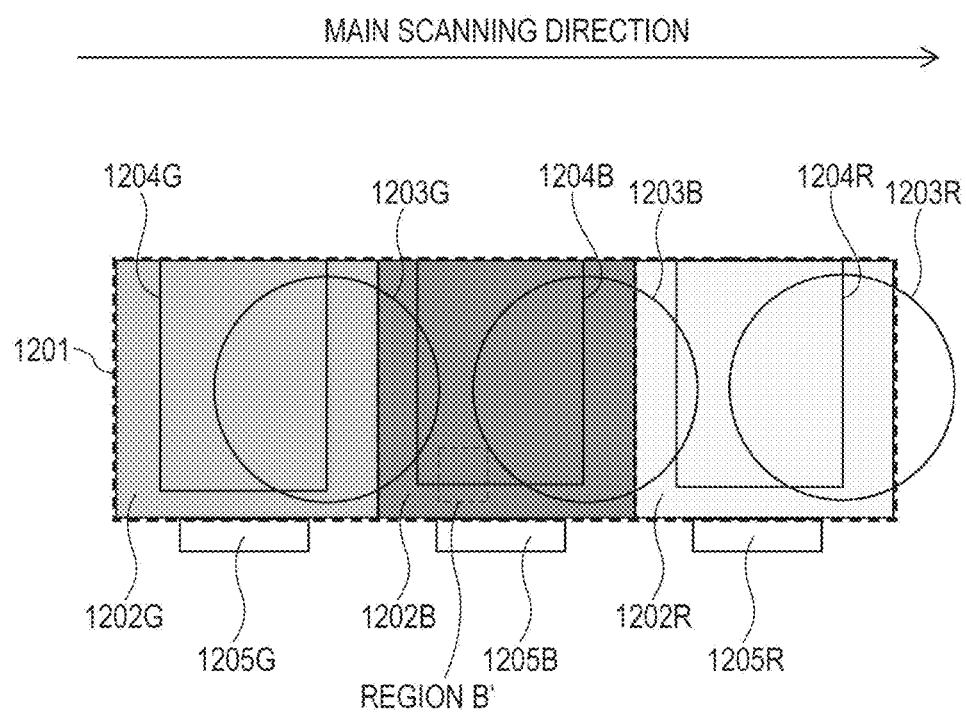
FIG. 15 is an explanatory view when the center of each microlens is displaced from the center of its corresponding photodiode and the center of each color filter is not displaced from the center of its corresponding photodiode.

By displacing the microlenses 1203 and the color filters 1202 as in the embodiment, it is possible to more effectively suppress the occurrence of a ghost. FIG. 15 illustrates a case when the center of each microlens 1203 is displaced from the center of its corresponding photodiode 1204 and the center of each color filter 1202 is not displaced from the center of its corresponding photodiode 1204. As shown in FIG. 15, a region B' between the microlens 1203G and the corresponding microlens 1203B, which causes multiple interaction of incident light, is only formed at the color filter 1202B. In the structure such as that shown in FIG. 15 in which an interaction of reflected light tends to occur at the color filter 1202 of one color, multiple interaction tends to occur. In contrast, in the case of the embodiment shown in FIG. 13A, since color filters of two colors, that is, the color filter 1202G and the color filter 1202B exist in a corresponding region B, the effects of multiple interaction can be made small.

Third Embodiment

A third embodiment according to the present invention is described with reference to FIGS. 16, 17, and 18. The third embodiment is the same as the first embodiment except that the shapes of color filters 1202 differ. Therefore, the same structural features are not described below.

Figure 16:
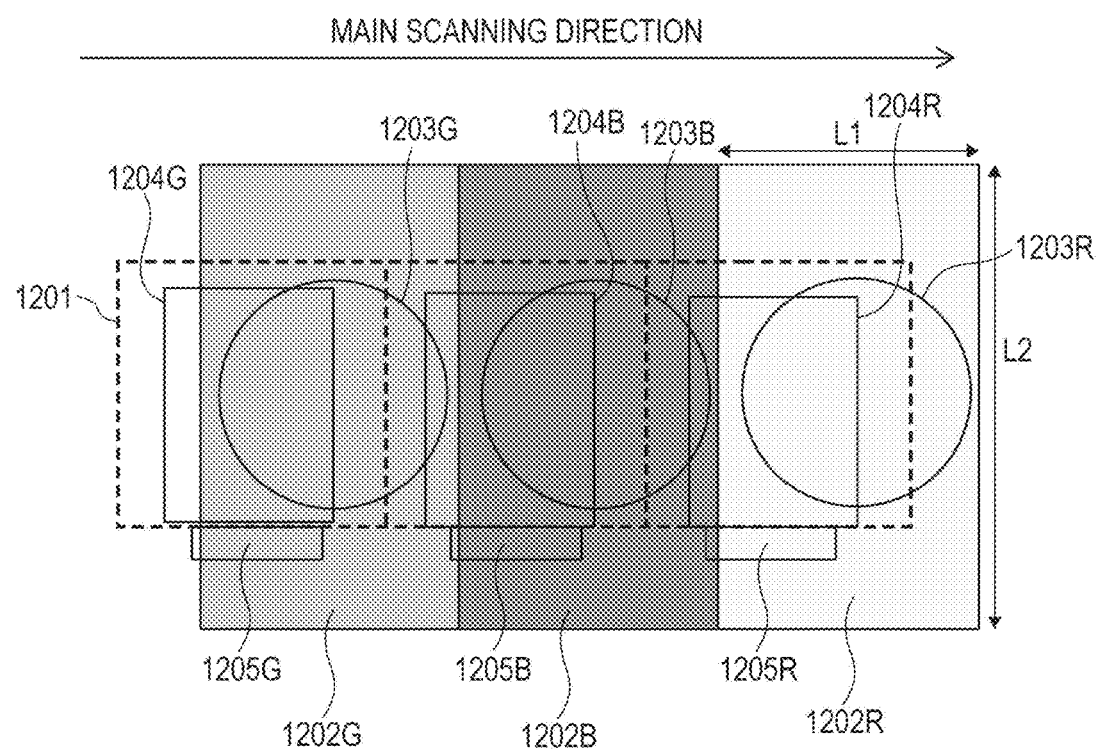
FIG. 16 is a figure for describing the relationship between the positions of color filters, microlenses, and photodiodes according to a third embodiment.

FIG. 16 is a plan view of three pixels, that is, a G pixel, a B pixel, and a G pixel, of a CMOS sensor according to the third embodiment of the present invention. FIG. 17 is a figure for describing the relationship between the positions of the color filters 1202 corresponding to light-receiving-element rows of a plurality of lines.

Figure 17:
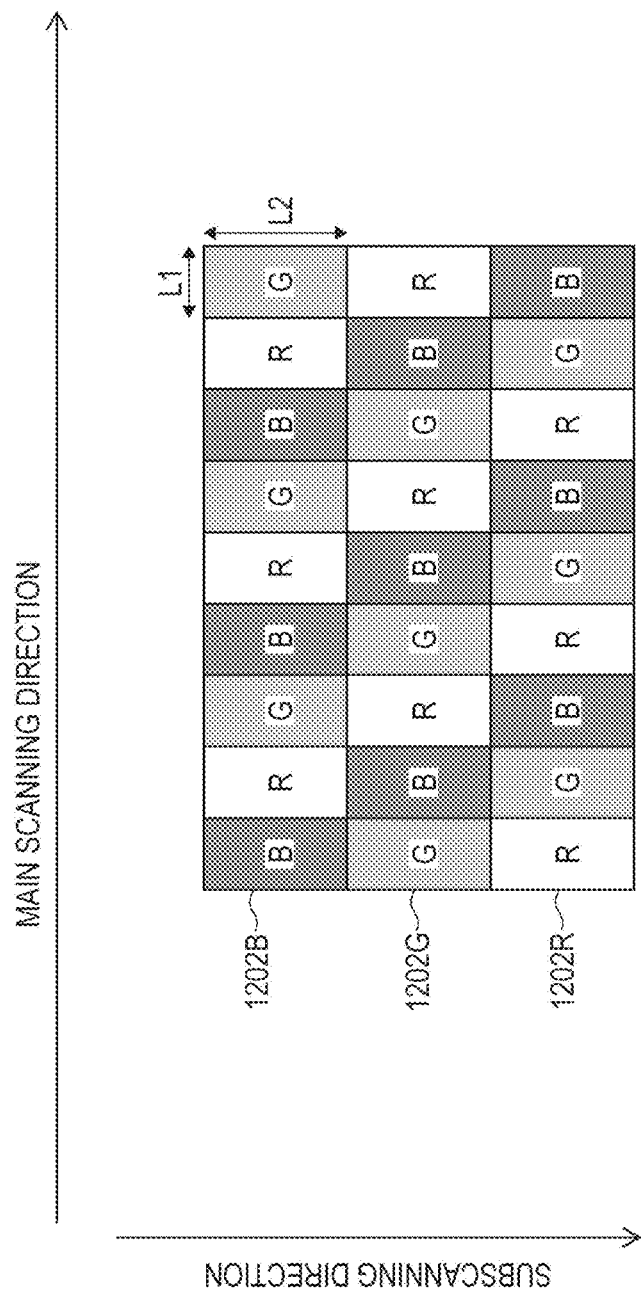
FIG. 17 is a figure for describing the relationship between the positions of the color filters corresponding to light-receiving-element rows of a plurality of lines according to the third embodiment.

As shown in FIGS. 16 and 17, a feature of the third embodiment is that the color filters 1202 are large in the subscanning direction and that regions between the light-receiving-element rows in the subscanning direction are also covered by the color filters 1202. In contrast, in the first embodiment, since the color filters 1202 are not large in the subscanning direction, as shown in FIG. 2A, the color filters 1202 do not exist in the regions between the light-receiving-element rows.

In the third embodiment, the color filters 1202 cover gate electrodes 1205 of pixel transfer transistors. When a width of each color filter 1202 in the main scanning direction is L1, and the width of each color filter 1202 in the subscanning direction is L2, L1<L2. When the interval between the light-receiving-element rows is L1×2, it is desirable that L2=L1×2.

By virtue of the above-described structure, it is possible to suppress ghost light caused by unnecessary reflected light from a location between adjacent light-receiving element rows. Wires, such as power supply wires and signal wires, are disposed in the regions between the light-receiving-element rows. Light reflected by these wires may cause a ghost to occur.

In the third embodiment, since the color filters 1202 also exist at the regions between the light-receiving-element rows, even in these regions, it is possible reduce the intensity of light as a result of the transmission of light through the color filters. Therefore, the intensity of light reflected towards the color filters 1202 from the wires is reduced, as a result of which the occurrence of a ghost can be reduced.

Figure 18:
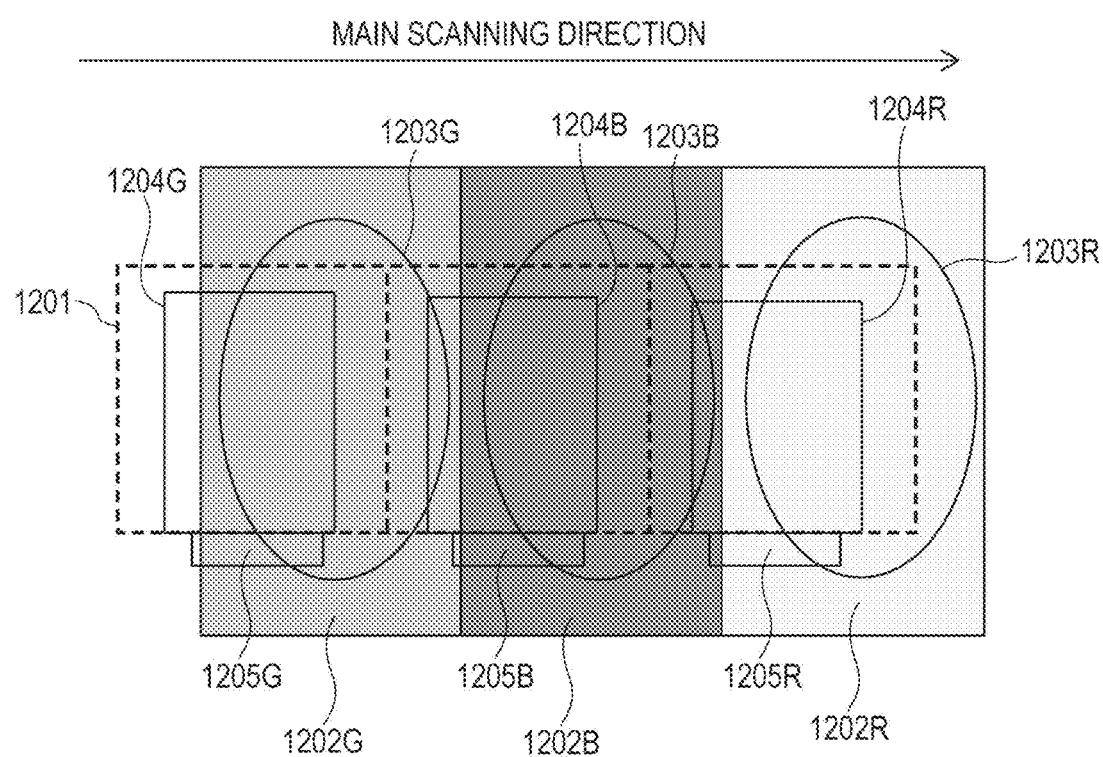
FIG. 18 is a figure for describing a modification of the third embodiment.

FIG. 18 is a figure for describing a modification of the third embodiment. The microlenses 1203 have elliptical shapes. The color filters 1202 are larger than the microlenses 1203.

Fourth Embodiment

A fourth embodiment according to the present invention is described with reference to FIGS. 19, 20, 21, and 22. The fourth embodiment is the same as the first embodiment except that the structures of wires 1207 (or vertical wires 1406, horizontal wires 1407), which are wire sections, are made clear in relation to the first embodiment. Therefore, the same structural features are not described below.

FIG. 19 illustrates the structures of three pixels, that is, a G pixel, a B pixel, and an R pixel, of a CMOS filter according to the fourth embodiment. FIG. 19A is a plan view. FIG. 19B is a sectional view of locations along XIXB-XIXB in FIG. 19A. FIG. 19C is a sectional view of locations along XIXC-XIXC in FIG. 19A.

As shown in FIG. 19A, the wires 1207 are provided so as to surround photodiodes 1204. Light that has been transmitted through color filters 1202 is transmitted through openings formed by the wires 1207, and is incident upon the photodiodes 1204. A feature of the fourth embodiment is that the openings formed by the wires 1207 are larger than the photodiodes 1204 in the subscanning direction. That is, as shown in FIG. 19C, in the subscanning direction, an open width W1 of the wires 1207 is larger than a width W2 of the photodiodes 1204 (W1>W2). In contrast, as shown in FIG. 19B, in the main scanning direction, an open width W3 of the wires 1207 is less than a width W4 of the photodiodes 1204 (W3<W4). These are determined from the viewpoint that pitches between adjacent pixels are small and from the viewpoint of suppressing the occurrence of a mixture of colors.

FIG. 20 illustrates another example of the structures of three pixels, that is, a G pixel, a B pixel, and an R pixel, of the CMOS sensor according to the fourth embodiment. FIG. 20A is a plan view, FIG. 20B is a sectional view of locations along XXB-XXB in FIG. 20A. FIG. 20C is a sectional view of locations along XXC-XXC in FIG. 20A. FIG. 20 differs from FIG. 19 in that the openings are formed by the vertical wires 1406 extending in the subscanning direction and the horizontal wires 1407 extending in the main scanning direction. As shown in FIG. 20C, in this example, the horizontal wires 1407 are disposed closer to the color filters 1202 than the vertical wires 1406 are by H1 in a direction Z (a third direction orthogonal to the first direction and the second direction). In the subscanning direction, an open width W1 of the horizontal wires 1407 is larger than the width W2 of the photodiodes 1204.

Figure 21A:
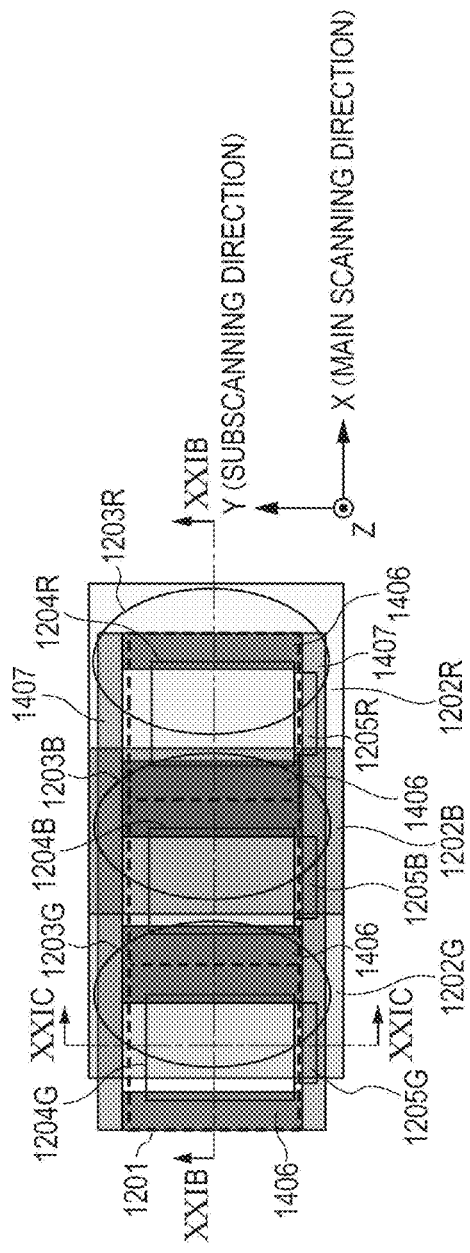
FIG. 21A is a plan view that describes the relationship between the positions of the color filters, elliptical microlenses, the vertical wires, and the horizontal wires according to a modification of the fourth embodiment.
Figure 21C:
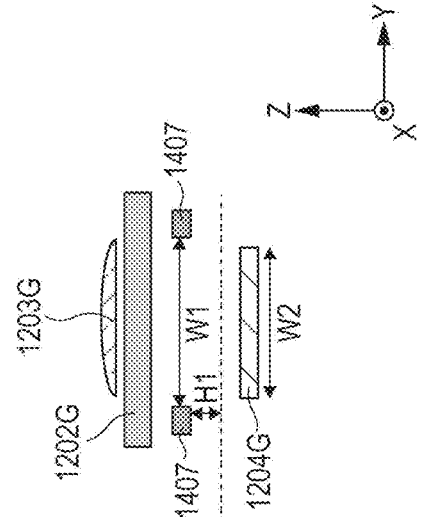
FIG. 21C is a sectional view of locations along XXIC-XXIC in FIG. 21A.
Figure 21B:
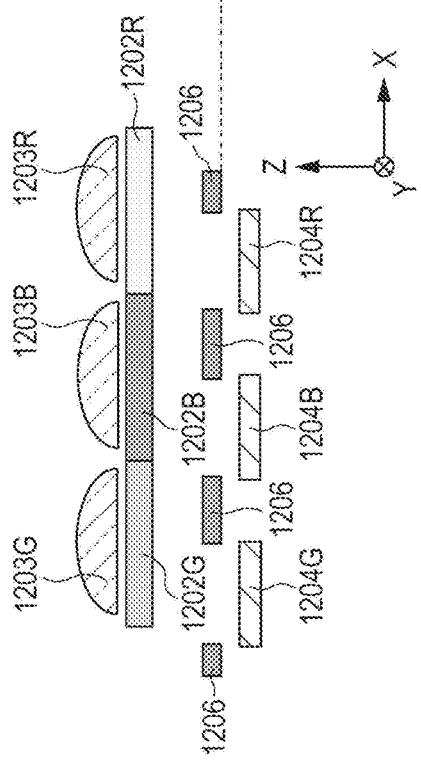
FIG. 21B is a sectional view of locations along XXIB-XXIB in FIG. 21A.

FIG. 21 illustrates still another example of the structures of three pixels, a G pixel, a B pixel, and an R pixel, of the CMOS sensor according to the fourth embodiment. In this example, the microlenses 1203 have elliptical shapes that are long in the subscanning direction. The color filters 1202 are also long in the subscanning direction in accordance with the shapes of the microlenses 1203. As shown in FIG. 21C, in this example, the horizontal wires 1407 are disposed closer to the microlenses 1203 than the vertical wires 1406 are by H1 in the direction Z. In the subscanning direction, the open width W1 of the horizontal wires 1407 is larger than the width W2 of the photodiodes 1204.

As described above, in the subscanning direction, the open width W1 of the wires 1207 (or the horizontal wires 1407) is larger than the width W2 of the photodiodes 1204.

Therefore, light that has been transmitted through the color filters 1202 are unlikely to be blocked by the wires 1207 (or the horizontal wires 1407), as a result of which a reduction in sensitivity of the photodiodes 1204 is suppressed. Even if the wires 1207 (or the horizontal wires 1407) and the photodiodes 1204 are misaligned during manufacturing, it is possible to reduce variations in the sensitivity of each sensor. It is desirable that the relationship between W1 and W2 be $1.01 \times W2 \leq W1 \leq 1.5 \times W2$. When $1.01 \times W2 > W1$, the effect of suppressing the occurrence of misalignment that occurs during manufacturing becomes small. When $W1 > 1.5 \times W2$, stray light tends to be incident upon the photodiodes 1204, as a result of which a reading image quality is reduced.

Figure 22A:
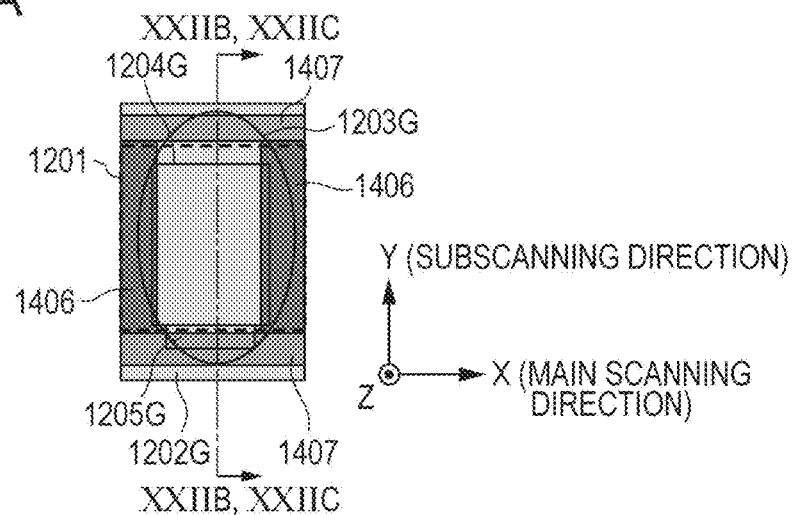
FIG. 22A is a plan view for describing incident light when an elliptical microlens is used in the modification of the fourth embodiment.
Figure 22B:
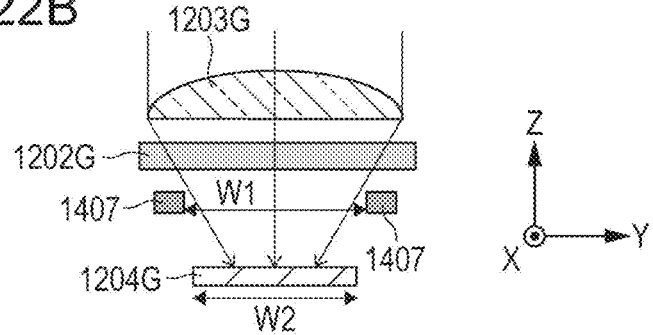
FIG. 22B is a sectional view of a location along XXIIB-XXIIB in FIG. 22A, and is an explanatory view of an example in which an open width W1 of a horizontal wire and a width W2 of a photodiode have the relationship W1>W2.
Figure 22C:
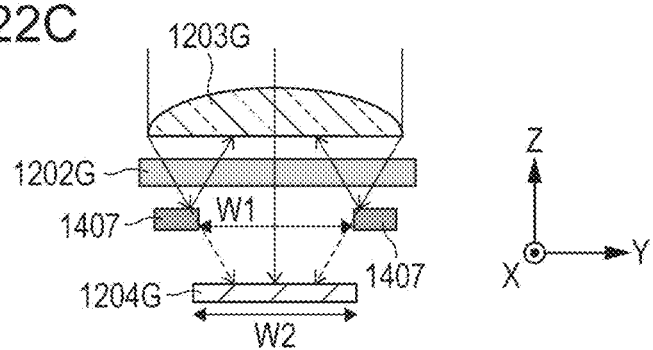
FIG. 22C is a sectional view of a location along XXIIC-XXIIC in FIG. 21A, and is an explanatory view of an example in which the open width W1 of the horizontal wire and the width W2 of the photodiode have the relationship W1<W2.

The effects of the fourth embodiment when elliptical microlenses are used are described by using FIG. 22. FIG. 22 is a schematic view of incident lights (arrows) when the elliptical lenses shown in FIG. 21 are used. FIG. 22A is a plan view. In FIG. 22, for simplifying the description, an example in which the color filter 1202G and the photodiode 1204G are not shifted in the direction X is used for describing the effects. In FIG. 22B, the open width W1 of horizontal wires 1407 is in the relationship W1>W2. In FIG. 22C, the open width W1 of the horizontal wires 1407 is in the relationship W1<W2.

When the power of elliptical microlenses and the power of perfectly circular microlenses are compared, and when the short diameter (diameter in the main scanning direction) of the elliptical microlenses and the diameters of the perfectly circular microlenses are the same, the power of the elliptical microlenses in the subscanning direction is less than the power of the perfectly circular microlenses in the subscanning direction.

Therefore, when W1<W2, compared to the perfectly circular microlenses, light incident upon the photodiode 1204G from the microlens 1203G tends to be blocked by the horizontal wires 1407, as a result of which a reduction in sensitivity tends to occur. Therefore, when using the elliptical microlenses, by making W1>W2, blockage of incident light by the horizontal wires 1407 is reduced, and the effect of suppressing a reduction in sensitivity is greater than that when the perfectly circular microlenses are used. Even if the elliptical microlenses are used, it is possible to suppress variations in sensitivity of each sensor during manufacturing as when the perfectly circular microlenses are used.

Fifth Embodiment

A fifth embodiment according to the present invention is described with reference to FIG. 23. In the first embodiment, the CMOS sensor 107 includes three light-receiving-element rows, that is, line 1, line 2, and line 3, whereas in the fifth embodiment, a light-receiving-element row, that is, line 4 is further added to the lines according to the first embodiment. The points that differ from those according to the first embodiment are described, and the structural features that are the same as those according to the first embodiment are not described.

Figure 23:
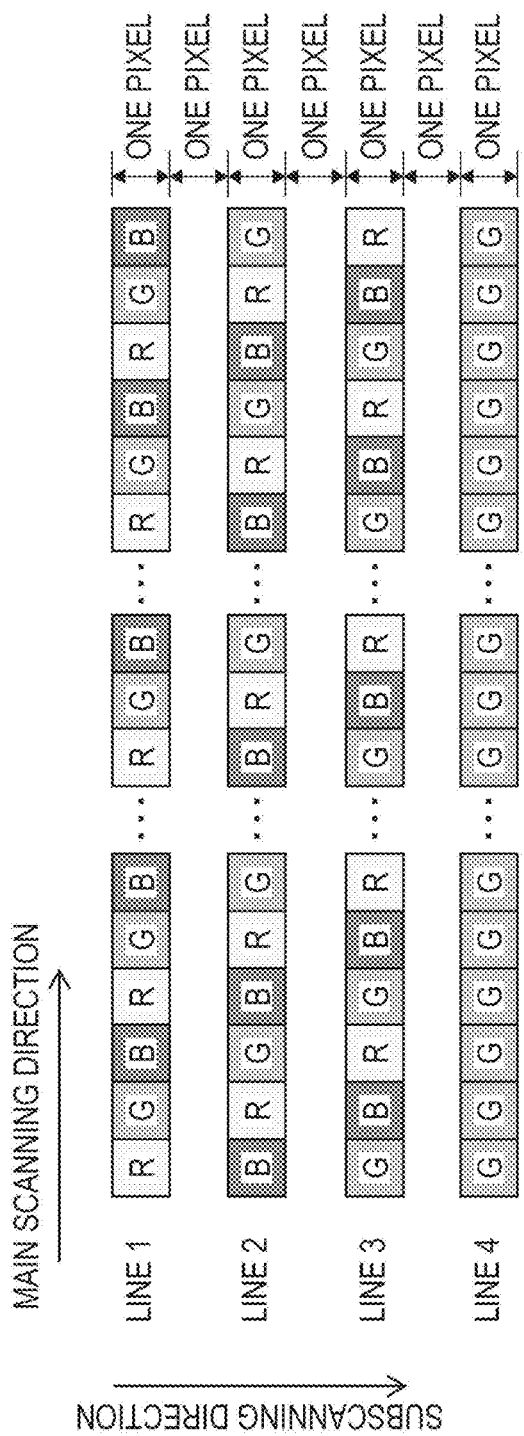
FIG. 23 illustrates arrangements of color filters of corresponding to light-receiving-element rows according to a fifth embodiment.

FIG. 23 illustrates arrangements of color filters of the CMOS sensor 107 according to the fifth embodiment. As in the first embodiment, the color filters at lines 1, 2, and 3 are periodically disposed in the order R→G→B→R→G→B . . . in the main scanning direction. In contrast, at line 4, G color filters 1202G (fourth transmitting portions) are successively disposed side by side instead of being periodically disposed in the main scanning direction.

In the fifth embodiment, a switching unit that switches between a first mode in which reading is performed by using lines 1, 2, and 3 and in a second mode in which reading is performed by using line 4 when reading a monochromatic image is provided. When a monochromatic image is read by using lines 1, 2, and 3, the reading is performed on the basis of light that is incident upon photodiodes 1204G corresponding to the green color filters (color filters 1202G) at lines 1, 2, and 3.

An advantage of the case where reading is performed by using lines 1, 2, and 3 in which the color filters 1202 are periodically disposed in the order R→G→B is that inappropriate coloring that occurs when reading a curved metal object (such as a spray can) can be suppressed.

Figure 24:
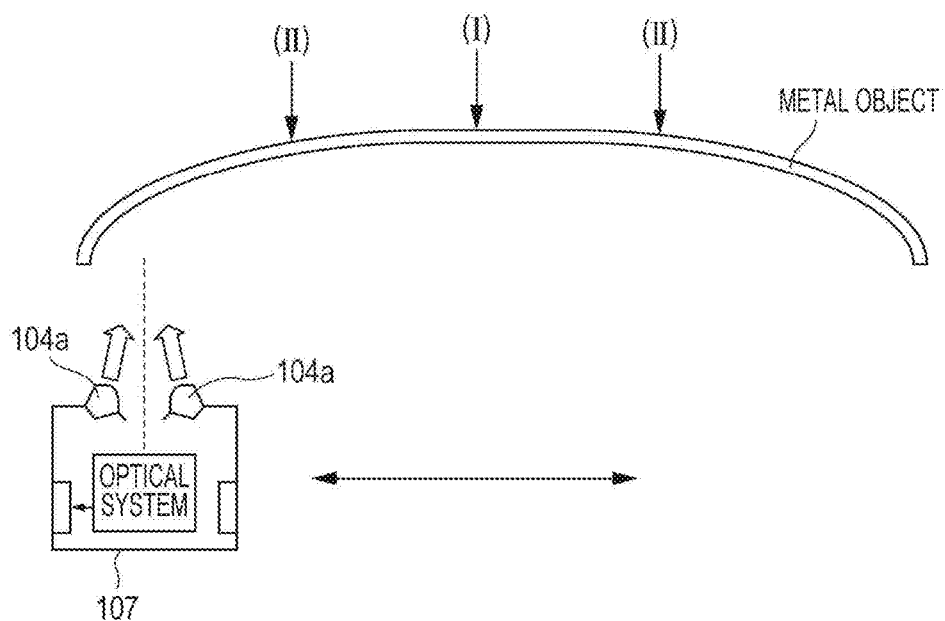
FIG. 24 is an explanatory view when a curved metal object is read.

This advantage is explained by using FIG. 24. FIG. 24 is an explanatory view when a curved metal object is read. In FIG. 24, an optical system is shown in a simplified manner without showing the folding mirror 105a, etc., shown in FIG. 1.

Since a metal has high light reflectivity, light that is emitted from the white light LED 104a and the white light LED 104b is specularly reflected by a surface of the metal object, and brightness information that is acquired by the photodiodes 1204 of the CMOS sensor 107 indicates a high value.

A location (I) corresponds to a location on the metal object that is flat. Therefore, even if the specularly reflected light is incident upon the CMOS sensor 107, reflected light is uniformly incident upon lines 1, 2, and 3 of the CMOS sensor 107.

In contrast, a location (II) corresponds to a location on the metal object that is curved. Since an optical system of a reading unit is designed on the assumption that the object is flat, when a curved object is read, reflected light may not be uniformly incident upon lines 1, 2, and 3 of the CMOS sensor 107. Therefore, when the metal object has been read, it is possible that the specularly reflected light may only be incident upon line 1, and may not be incident upon the other lines.

For example, the case in which an existing CMOS sensor (including only R color filters at line 1, only G color filters at line 2, and only B color filters at line 3) is used, and specularly reflected light is incident only upon line 1 and is not incident upon lines 2 and 3 is considered. In this case, a reading image in which the brightness of R is higher than those of G and B is formed for the region (II). That is, the reading image becomes one that is colored red, as a result of which the image has a color that is considerably different from that of an original.

In contrast, when reading is performed by using lines 1, 2, and 3 in which the color filters 1202 are periodically disposed in the order R→G→B, pieces of data regarding the brightnesses of an image that has been read at line 1 upon which the specularly reflected light is incident becomes "R=255→G=255→B=255→R=255 . . . " (the maximum of the pieces of brightness information is assumed as being 255) in the main scanning direction. Even in this case, the value of brightness information acquired at line 1 is higher than those acquired at lines 2 and 3. However, since the changes are fine periodic changes R→G→B, it is possible to suppress the production of an image that is colored by one color as when an existing CMOS sensor is used.

However, when incident light is inclined as mentioned above, light that has been transmitted through adjacent color filters 1202B and 1202R is incident upon the photodiode 1204G, as a result of which a mixture of colors occurs. When a color image is to be read, control to correct a mixture of colors on the basis of information acquired from all of the photodiodes 1204 corresponding to RGB in lines 1, 2, and 3 can be performed. However, when a monochromatic image is to be read, only information from the photodiodes 1204 corresponding to G in lines 1, 2, and 3 is acquired for increasing the reading speed. Therefore, control to correct a mixture of colors cannot be performed. Consequently, when a monochromatic image is to be read, proper image information may no longer be acquired. In contrast, when a monochromatic image is to be read by using only line 4, the problem of a mixture of colors does not occur because the color filters 1202G are disposed side by side in the main scanning direction.

Whether or not the effects of a mixture of colors are large when a monochromatic image is to be read by using lines 1, 2, and 3 is influenced by the accuracy of the positions of, for example, the color filters 1202 and the photodiodes 1204 during manufacturing. Therefore, although a mixture of colors tends to occur in a CMOS sensor in a certain manufacturing lot, there are cases in which a mixture of colors is unlikely to occur in a CMOS sensor 107 in another manufacturing lot.

Accordingly, when a monochromatic image is to be read, the CPU 401 is capable of performing control such that selection is made between reading using lines 1, 2, and 3 (reading in the first mode) and reading using line 4 (reading in the second mode). For example, before shipping a product from a plant, a program for determining whether reading is to be performed in the first mode or in the second mode is stored in the nonvolatile memory 402 that stores the control program of the CPU 401. When this is done, reading of an optimum monochromatic image can be set in accordance with differences between individual CMOS sensors. Alternatively, a program for reading in the first mode and a program for reading in the second mode may be both stored in the nonvolatile memory 402. It is possible to carry out a method of separately providing a determination flag to determine which program in the nonvolatile memory 402 is to be executed, or a method of selecting which program is to be executed by using a mechanical switch provided on a substrate.

Although examples of previously setting the first mode and the second mode before shipment from a plant are described, the present invention is not limited thereto. A user may switch between reading in the first mode and reading in the second mode by operating the operating portion 403, which is a user interface.

Still alternatively, regardless of differences between individual CMOS sensors, the CMOS sensors may be set such that reading is performed by using lines 1, 2, and 3 when a color image is to be read, and reading is performed by using line 4 when a monochromatic image is to be read.

If control to correct a mixture of colors when a color image is to be read is satisfactorily performed, the center of each color filter 1202 and the center of its corresponding photodiode 1204 need not be displaced from each other. That is, a color image is read by using lines 1, 2, and 3 taking into consideration reading of a curved metal object. A monochromatic image is read by using line 4 because a mixture of colors cannot be corrected.

In the description above, although the color filters 1202 at line 4 are described as being the same type as the color filters 1202G at lines 1, 2, and 3 (the wavelength of light that is transmitted through the color filters 1202 at line 4 is the same as the wavelength of light that is transmitted through the color filters 1202G at lines 1, 2, and 3), the present invention is not limited thereto. When a monochromatic image is to be read, color tones do not have any effect. Therefore, in order to increase the intensity of light that is incident upon the photodiodes 1204, the color filters 1202 may be color filters of a lighter shade of green than that of the color filters 1202G at line 1, etc., or may be transparent color filters.

Other

Although in the above-described embodiments, color filters of three colors are used, the present invention is not limited thereto. For example, color filters of two colors may be used. In addition, although the centers of color filters of all three colors are displaced from the centers of their corresponding photodiodes, only color filters of two colors that tend to cause the problem of a mixture of colors among the color filters of three colors may be displaced therefrom. Alternatively, it is possible to displace the centers of color filters disposed only in the regions of the end portions of the light-receiving-element rows that tend to cause a mixture of colors from the centers of their corresponding photodiodes, and not to displace central regions of the light-receiving-element rows or intermediate regions thereof (regions between the central regions and the end portion regions).

Although a CMOS sensor is used as an example of the line sensor, a different type of sensor, such as a CCD (charge coupled device) sensor, may also be used as the line sensor. Although, in the embodiments, an electrophotographic image forming apparatus is used as an example of an image forming apparatus to which the line sensors according to the embodiments are applied, the present invention is not limited thereto. The line sensors according to the embodiments may be applied to, for example, an inkjet printer that forms an image on a sheet by discharging ink.

According to the present invention, it is possible to provide a line sensor that is capable of suppressing a "mixture of colors", and an image reading device and an image forming apparatus using the line sensor.

The present invention is not limited to the above-described embodiments. Various changes and modifications can be made without departing from the spirit and scope of the present invention. Therefore, the following claims are attached to make public the scope of the present invention.

The invention claimed is:

1. A line sensor comprising:
a first light-receiving-element row, a second light-receiving-element row and a third light-receiving-element row each including a plurality of light receiving elements that are disposed in a first direction, the first light-receiving-element row, the second light-receiving-element row, and the third light-receiving-element row being disposed at a predetermined interval in a second direction orthogonal to the first direction;
a first plurality of transmitting portions each corresponding to a different one of the plurality of light receiving elements disposed in the first light-receiving-element row,
a second plurality of transmitting portions each corresponding to a different one of the plurality of light receiving elements disposed in the second light-receiving-element row,
a third plurality of transmitting portions each corresponding to a different one of the plurality of light receiving elements disposed in the third light-receiving-element row.
wherein each of the first plurality of transmitting portions, the second plurality of transmitting portions and the third plurality of transmitting portions, includes a first transmitting portion transmitting light having a first wavelength, a second transmitting portion transmitting light having a second wavelength different from the first wavelength, and a third transmitting portion transmitting light having a third wavelength different from both the first wavelength and the second wavelength,
a first plurality of condensing portions each corresponding to a different one of the plurality of light receiving elements disposed in the first light-receiving-element row,
a second plurality of condensing portions each corresponding to a different one of the plurality of light receiving elements disposed in the second light-receiving-element row,
a third plurality of condensing portions each corresponding to a different one of the plurality of light receiving elements disposed in the third light-receiving-element row,
wherein each of the first light-receiving-element row, the second light-receiving-element row and the third light-receiving-element row includes a light receiving element corresponding to the first transmitting portion, a light receiving element corresponding to the second transmitting portion disposed adjacent to the first transmitting portion in the first direction, and a light receiving element corresponding to the third transmitting portion disposed adjacent to the second transmitting portion in the first direction,
wherein in the first light-receiving-element row, a distance, in the first direction between a center of the first light-receiving-element row and a center of a first light receiving element disposed on a first position in the first direction is longer than a distance, in the first direction, between the center of the first light-receiving-element row and a center of a transmitting portion corresponding to the first light receiving element,
a distance, in the first direction, between the center of the first light-receiving-element row and a center of a second light receiving element adjacent to the first light receiving element is longer than a distance in the first direction, between the center of the first light-receiving-element row and a center of a transmitting portion corresponding to the second light receiving element,
a distance, in the first direction, between the center of the first light-receiving-element row and the first position is longer than a distance, in the first direction, between the center of the first light-receiving-element row and a second position where the second light receiving element is disposed,
a distance, in the first direction, between the center of the first light receiving element and the center of the transmitting portion corresponding to the first light receiving element is longer than a distance, in the first direction, between the center of the second light receiving element and the center of the transmitting portion corresponding to the second light receiving element,
wherein a condensing portion corresponding to the first light receiving element is disposed opposite to the first light receiving element with respect to a transmitting portion corresponding to the first light receiving element in a third direction orthogonal to both the first direction and the second direction, and
wherein the distance, in the first direction, between the center of the first light-receiving-element row and the center of the first light receiving element is longer than a distance, in the first direction, between the center of the first light-receiving-element row and a center of the condensing portion corresponding to the first light receiving element, the distance, in the first direction, between the center of the first light-receiving-element row and the center of the second light receiving element is longer than a distance, in the first direction, between the center of the first light-receiving-element row and a center of a condensing portion corresponding to the second light receiving element, a distance, in the first direction, between the center of the first light receiving element and the center of the condensing portion corresponding to the first light receiving element is longer than a distance, in the first direction, between the center of the second light receiving element and the center of the condensing portion corresponding to the second light receiving element, and wherein a distance, in the first direction, between the center of the first light-receiving-element row and an end portion of the first light receiving element positioned opposite to a center side of the first light receiving element row in the first direction, is longer than a distance, in the first direction, between the center of the first light-receiving-element row and an end portion of the transmitting portion corresponding to the first light-receiving element positioned opposite to the center side in the first direction, a distance, in the first direction, between the center of the first light-receiving-element row and an end portion of the second light receiving element positioned opposite to the center side in the first direction, is longer than a distance, in the first direction, between the center of the first light-receiving-element row and an end portion of the transmitting portion corresponding to the second light receiving element positioned opposite to the center side in the first direction, wherein the first light-receiving-row includes a vertical wire extending in the second direction, disposed between the center of the first light receiving element and the center of the second light receiving element in the first direction, and includes a horizontal wire [wires] extending in the first direction, the vertical wire and the horizontal wire being disposed between the transmitting portion corresponding to the first light receiving element and the first light receiving element in the third direction, and wherein a transmitting portion corresponding to a light receiving element disposed on a third position in the first direction with respect to the first light-receiving-element row, a transmitting portion corresponding to a light receiving element disposed on the third position with respect to the second light-receiving-element row, and a transmitting portion corresponding to a light receiving element disposed on the third position with respect to the third light-receiving-element row, are transmitting portions each of which transmits different light with each other.

2. The line sensor according to claim 1, further comprising:

a first plurality of gate electrodes each corresponding to a different one of the plurality of light receiving elements disposed in the first light-receiving-element row, a second plurality of gate electrodes each corresponding to a different one of the plurality of light receiving elements disposed in the second light-receiving-element row, and a third plurality of gate electrodes each corresponding to a different one of the plurality of light receiving elements disposed in the third light-receiving-element row, wherein a gate electrode corresponding to [in correspondence with] the first light receiving element is disposed adjacent to the first light receiving element in the second direction, and a gate electrode corresponding to the second light receiving element is disposed adjacent to the second light receiving element in the second direction.

3. The line sensor according to claim 1, wherein a center position of the condensing portion corresponding to the first light receiving element in the first direction is same as a center position of the transmitting portion corresponding to the first light receiving element in the first direction, and a center position of the condensing portion corresponding to the second light receiving element in the first direction is same as a center position of the transmitting portion corresponding to the second light-receiving-element in the first direction.

4. The line sensor according to claim 1, wherein the condensing portion corresponding to the first light receiving element is disposed apart from the condensing portion corresponding to the second light receiving element.

5. The line sensor according to claim 1, wherein the condensing portion corresponding to the first light receiving element has elliptical shape and a curvature radius of the condensing portion corresponding to the first light receiving element in the first direction is smaller than a curvature radius of the condensing portion corresponding to the first light receiving element in the second direction, and wherein the condensing portion corresponding to the second light receiving element has elliptical shape and a curvature radius to the condensing portion corresponding to the second light receiving element in the first direction is smaller than a curvature radius of the condensing portion corresponding to the second light receiving element in the second direction.

6. The line sensor according to claim 1, wherein an opening that allows light transmitted through the transmitting portion corresponding to the first light receiving element to be incident upon the first light receiving element, is formed by the vertical wire and the horizontal wire.

7. The line sensor according to claim 6, wherein the horizontal wire is disposed closer to the transmitting portions than the vertical wires in the third direction.

8. The line sensor according to claim 6, wherein a width of the opening in the second direction is wider than a width of the first light receiving element in the second direction.

9. The line sensor according to claim 6, wherein a width of the opening in the first direction is narrower than a width of the first light receiving element in the first direction.

10. The line sensor according to claim 1, wherein a width of the transmitting portion corresponding to the first light receiving element in the second direction is wider than a width of the transmitting portion corresponding to the first light receiving element in the first direction.

11. The line sensor according to claim 1, wherein a width of the transmitting portion corresponding to the first light receiving element in the second direction is wider than a width of the first light receiving element in the second direction, and a width of the transmitting portion corresponding to the second light receiving element in the second direction is wider than a width of the second light receiving element in the second direction.

12. The line sensor according to claim 1, further comprising:
a fourth light-receiving-element row including a plurality of light receiving elements disposed in the first direction and a fourth plurality of transmitting portions each corresponding to a different one of the plurality of light receiving elements,
wherein the fourth plurality of transmitting portions includes a fourth transmitting portion transmitting [that are disposed in correspondence with the plurality of light receiving elements and that transmit] light having a predetermined wavelength, and
wherein the first light-receiving-element row, the second light-receiving-element row, the third light-receiving-element row, and the fourth light-receiving-element row are disposed at a predetermined interval in the second direction.

13. The line sensor according to claim 12, wherein the fourth transmitting portion transmits light having a wavelength that is the same as that of the light transmitted through the first transmitting portion.

14. The line sensor according to claim 1, wherein the first transmitting portion is red color filter, the second transmitting portion is green color filter, and the third transmitting portion is blue color filter.

15. The line sensor according to claim 1, wherein the line sensor is a CMOS sensor.

16. The line sensor according to claim 1, wherein the first transmitting portion, the second transmitting portion, and the third transmitting portion are periodically disposed in the first direction in each of the first light-receiving-element row, the second light-receiving-element row, and the third light-receiving-element row.

17. An image reading apparatus configured to read an image on a document, the apparatus, comprising:
a light emitting unit configured to illuminate the document with light; and
a line sensor configured to receive light reflected from the document,
wherein the line sensor comprises:
a first light-receiving-element row, a second light-receiving-element row and a third light-receiving-element row each including a plurality of light receiving elements that are disposed in a first direction, the first light-receiving-element row, the second light-receiving-element row, and the third light-receiving-element row being disposed at a predetermined interval in a second direction orthogonal to the first direction;
a first plurality of transmitting portions each corresponding to a different one of the plurality of light receiving elements disposed in the first light-receiving-element row,
a second plurality of transmitting portions each corresponding to a different one of the plurality of light receiving elements disposed in the second light-receiving-element row,
a third plurality of transmitting portions each corresponding to a different one of the plurality of light receiving elements disposed in the third light-receiving-element row,
wherein the first transmitting portions includes a first transmitting portion transmitting light having a first wavelength, the second transmitting portions includes a second transmitting portion transmitting light having a second wavelength different form the first wavelength, and the third transmitting portions includes a third transmitting portion transmitting light having a third wavelength different from both the first wavelength and the second wavelength,
a first plurality of condensing portions each corresponding to a different one of the plurality of light receiving elements disposed in the first light-receiving-element row,
a second plurality of condensing portions each corresponding to a different one of the plurality of light receiving elements disposed in the second light-receiving-element row,
a third plurality of condensing portions each corresponding to a different one of the plurality of light receiving elements disposed in the third light-receiving-element row,
wherein each of the first light-receiving-element row, the second light-receiving-element row and the third light-receiving-element row includes a light receiving element corresponding to the first transmitting portion, a light receiving element corresponding to the second transmitting portion disposed adjacent to the first transmitting portion, and a light receiving element corresponding to the third transmitting portion disposed adjacent to the second transmitting portion,
wherein in the first light-receiving-element row, a distance, in the first direction, between a center of the first light receiving-element-row and a center of a first light-receiving element disposed on a first position in the first direction is longer than a distance, in the first direction, between the center of the first light-receiving-element row and a center of a transmitting portion corresponding to the first light receiving element,
a distance, in the first direction , between the center of the first light-receiving-row and a center of a second light receiving element adjacent to the first light receiving element is longer than a distance, in the first direction, between the center of the first light-receiving-element row and a center of a transmitting portion corresponding to the second light receiving element,
a distance, in the first direction, between the center of the first light-receiving-element row and the first position is longer than a distance, in the first direction, between the center of the first light-receiving-element row and a second position where the second light receiving element is disposed,
wherein a condensing portion corresponding to the first light receiving element is disposed opposite to the first light receiving element with respect to a transmitting portion corresponding to the first light receiving element in a third direction orthogonal to both the first direction and the second direction, and
wherein the distance, in the first direction, between the center of the first light-receiving-element row and the center of the first light receiving element is longer than a distance, in the first direction, between the center of the first light-receiving-element row and a center of the condensing portion corresponding to the first light receiving element,
the distance, in the first direction, between the center of the first light-receiving-element row and the center of the second light receiving element is longer than a distance, in the first direction, between the center of the first light-receiving-element row and center of the condensing portion corresponding to the second light-receiving element,
a distance, in the first direction, between the center of the first light receiving element and the center of the condensing portion corresponding to the first light receiving element is longer than a distance, in the first direction, between the center of the second light receiving element and the center of the condensing portion corresponding to the second light receiving element, and wherein, in the first direction, a distance between the center of the first light-receiving-element row and an end portion of the first light-receiving-element positioned opposite to a center side of the first light-receiving-element row in the first direction, is longer than a distance, in the first direction, between the center of the first light-receiving-element row and an end portion of the transmitting portion corresponding to the first light receiving element positioned opposite to the center side in the first direction, a distance, in the first direction, between the center of the first light-receiving-element row and an end portion of the second light receiving element positioned opposite to the center side in the first direction, is longer than a distance, in the first direction, between the center of the first light-receiving-element row and an end portion of the transmitting portion corresponding to the second light-receiving element positioned opposite to the center side in the first direction, wherein the first light-receiving-element row includes a vertical wire extending in the second direction and disposed between a the center of the first light receiving element and the center of the second light-receiving-element in the first direction, and includes a horizontal wire extending in the first direction, the vertical wire and the horizontal wire being disposed between the transmitting portion corresponding to the first light receiving element and the first light receiving element in the third direction, and wherein a transmitting portion corresponding to a light receiving element disposed on a third position in the first direction with respect to the first light-receiving-element row, a transmitting portion corresponding to a light receiving element disposed on the third position with respect to the second light-receiving-element row, and the transmitting portion corresponding to a light-receiving element disposed on the third position with respect to the third light-receiving-element row, are transmitting portions each of which transmits different light with each other.

18. The image reading apparatus according to claim 17, wherein the line sensor further comprises:
a fourth light-receiving-element row including a plurality of light receiving elements disposed in the first direction and a fourth plurality of transmitting portions each of which corresponds to a different one of the plurality of light receiving elements disposed in the fourth light-receiving-element row,
wherein the first light-receiving-element row, the second light-receiving-element row, the third light-receiving-element row, and the fourth light-receiving-element row are disposed at a predetermined interval in the second direction, and
wherein the image reading apparatus comprises a controller configured to, in a case where reading a monochromatic image is performed, execute reading in a first mode by using the first light-receiving-element row, the second light-receiving-element row, and the third light-receiving-element row, or to execute reading in a second mode to read an image by using the fourth light-receiving-element row.

19. The image reading apparatus according to claim 18 further comprising:
a setting unit configured to set whether to execute the first mode or the second mode as a mode to read an image, wherein the controller executes the reading mode set by the setting unit.

20. The image reading apparatus according to claim 18, wherein the controller executes the first mode in a case where reading a color image is performed and executes the second mode in a case where reading a monochromatic image is performed.

21. The image reading apparatus according to claim 17, wherein, the first transmitting portion is red color filters, the second transmitting portion is green color filters, and the third transmitting portion is blue color filters.

22. The image reading apparatus according to claim 17, wherein the line sensor is a CMOS sensor.

23. An image forming apparatus configured to form an image on a sheet, the apparatus comprising:
a light emitting unit configured to illuminate a document with light; and
a line sensor configured to receive light reflected from the document;
a generation unit configured to generate image data based on the light receiving result of the line sensor; and
an image forming unit configured to form an image on the sheet based on the image data generated by the generation unit,
wherein the line sensor comprises:
a first light-receiving-element row, a second light-receiving-element row and a third light-receiving-element row each including a plurality of light receiving elements that are disposed in a first direction, the first light-receiving-element row, the second light-receiving-element row, and the third light-receiving-element row being disposed at a predetermined interval in a second direction orthogonal to the first direction;
a first plurality of transmitting portions each corresponding to a different one of the plurality of light receiving elements disposed in each of the first light-receiving-element row,
a second plurality of transmitting portions each corresponding to a different one of the plurality of light receiving elements disposed in the second light-receiving-element row [and],
a third plurality of transmitting portions each corresponding to a different one of the plurality of light receiving elements disposed in the third light-receiving-element row,
Wherein each of the first plurality of transmitting portions, the second plurality of transmitting portions and the third plurality of transmitting portions, includes a first transmitting portion transmitting light having a first wavelength, a second transmitting portion transmitting light having a second wavelength different from the first wavelength, and [the third transmitting portions transmit] a third transmitting portion transmitting light having a third wavelength different from both the first wavelength and the second wavelength,
a first plurality of condensing portions each corresponding to a different one of the first plurality of light receiving elements disposed in the first light-receiving-element row,
a second plurality of condensing portions each corresponding to a different one of the second plurality of light receiving elements disposed in the second light-receiving-element row, a third plurality of condensing portions each corresponding to a different one of the third plurality of light receiving elements disposed in the third light-receiving-element row, wherein each of the first light-receiving-element row, the second light-receiving-element row and the third light-receiving-element row includes a light receiving element corresponding to the first transmitting portion, a light receiving element corresponding to the second transmitting portion disposed adjacent to the first transmitting portion in the first direction, and a light receiving element corresponding to the third transmitting portion disposed adjacent to the second transmitting portion in the first direction, wherein in the first light-receiving-element row, a distance, in the first direction, between a center of the first light-receiving-element row and a center of a first light receiving element disposed on a first position in the first direction is longer than a distance in the first direction between the center of the first light-receiving-element row and a center of a transmitting portion corresponding to the first light receiving element, a distance in the first direction between the center of the first-light-receiving element row and a center of a second light receiving element adjacent to the first light receiving element is longer than a distance in the first direction between the center of the first light-receiving-element row and a center of a transmitting portion corresponding to the second light receiving element, a distance, in the first direction, between the center of the first light-receiving-element row and the first position is longer than a distance in the first direction between the center of the first light-receiving-element row and a second position where the second light receiving element is disposed, a distance, in the first direction, between the center of the first light receiving element and the center of the transmitting portion corresponding to the first light receiving element is longer than a distance, in the first direction, between the center of the second light receiving element and the center of the transmitting portion corresponding to the second light receiving element, wherein a condensing portion corresponding to the first light receiving element is disposed opposite to the first light receiving element with respect to a transmitting portion corresponding to the first receiving element in a third direction orthogonal to both the first direction and the second direction, wherein the distance in the first direction between the center of the first light-receiving-element row and the center of the first light receiving element is longer than a distance in the first direction between the center of the first light-receiving-element row and a center of the condensing portion corresponding to the first light receiving element, the distance, in the first direction, between the center of the first light-receiving-element row and the center of the second light receiving element is longer than a distance, in the first direction, between the first light-receiving-element row and a center of a condensing portion corresponding to the second light receiving element, a distance in the first direction between the center of the first light receiving element and the center of the condensing portion corresponding to the first light receiving element is longer than a distance, in the first direction, between the center of the second light receiving element and the center of the condensing portion corresponding to the second light receiving element, and wherein a distance, in the first direction, between the center of the first light-receiving-element row and an end portion of the first light receiving element positioned opposite to a center side of the first light-receiving-element row in the first direction, is longer than a distance, in the first direction, between the center of the first light-receiving-element row and an end portion of the transmitting portion corresponding to the first light receiving element positioned opposite to the center side in the first direction, a distance, in the first direction, between the center of the first light-receiving-element row and an end portion of the second light receiving element positioned opposite to the center side, in the first direction, is longer than a distance, in the first direction, between the center of the first light-receiving-element row and an end portion of the transmitting portion corresponding to the second light receiving element positioned opposite to the center side in the first direction, wherein the first light-receiving-element row includes a vertical wire extending in the second direction disposed between the center of the first light receiving element and the center of the second light receiving element in the first direction and includes a horizontal wire extending in the first direction, the vertical wire and the horizontal wire being disposed between the transmitting portion corresponding to the first light receiving element and the first light receiving element in the third direction, and wherein a transmitting portion corresponding to a light receiving element disposed on a third position in the first direction with respect to the first light-receiving-element row, a transmitting portion corresponding to a light receiving element disposed on the third position with respect to the second light-receiving-element row, and a transmitting portion corresponding to a light receiving element disposed on the third position with respect to the third light-receiving-element row, are a transmitting portions each of which transmits different light with each other.

24. The image forming apparatus according to claim 23, wherein the line sensor is a CMOS sensor.

* * * * *

UNITED STATES PATENT AND TRADEMARK OFFICE
CERTIFICATE OF CORRECTION

PATENT NO.       : 10,412,253 B2
APPLICATION NO.  : 16/036133
DATED            : September 10, 2019
INVENTOR(S)      : Daisuke Akagi Page 1 of 1

It is certified that error appears in the above-identified patent and that said Letters Patent is hereby corrected as shown below:

Column 20, Lines 37-47 (Claim 1) Should Read:
wherein the first light-receiving-row includes a vertical wire extending in the second direction, disposed between the center of the first light receiving element and the center of the second light receiving element in the first direction, and includes a horizontal wire extending in the first direction, the vertical wire and the horizontal wire being disposed between the transmitting portion corresponding to the first light receiving element and the first light receiving element in the third direction, and Column 22, Lines 5-12 (Claim 2) Should Read:
wherein a gate electrode corresponding to the first light receiving element is disposed adjacent to the first light receiving element in the second direction, and a gate electrode corresponding to the second light receiving element is disposed adjacent to the second light receiving element in the second direction.

Column 23, Lines 8-12 (Claim 12) Should Read:
wherein the fourth plurality of transmitting portions includes a fourth transmitting portion transmitting light having a predetermined wavelength, and Column 26, Lines 42-45 (Claim 23) Should Read:
a second plurality of transmitting portions each corresponding to a different one of the plurality of light receiving elements disposed in the second light-receiving-element row, Column 26, Lines 50-59 (Claim 23) Should Read:
Wherein each of the first plurality of transmitting portions, the second plurality of transmitting portions and the third plurality of transmitting portions, includes a first transmitting portion transmitting light having a first wavelength, a second transmitting portion transmitting light having a second wavelength different from the first wavelength, and a third transmitting portion transmitting light having a third wavelength different from both the first wavelength and the second wavelength, Signed and Sealed this
Second Day of June, 2020

Andrei Iancu
*Director of the United States Patent and Trademark Office*